(12) United States Patent
Miura et al.

(10) Patent No.: US 6,242,792 B1
(45) Date of Patent: Jun. 5, 2001

(54) SEMICONDUCTOR DEVICE HAVING OBLIQUE PORTION AS REFLECTION

(75) Inventors: Shoji Miura; Satoshi Shiraki, both of Nukata-gun; Tetsuaki Kamiya, Nagoya; Makio Iida, Ichinomiya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/315,132

(22) Filed: May 20, 1999

Related U.S. Application Data

(63) Continuation-in-part of application No. 08/885,192, filed on Jun. 30, 1997, now abandoned.

(30) Foreign Application Priority Data

Jul. 2, 1996 (JP) .................................................. 8-172366
May 20, 1998 (JP) ................................................ 10-138849

(51) Int. Cl.$^7$ ........................................................... H01L 29/41
(52) U.S. Cl. ........................... 257/536; 257/638; 257/516
(58) Field of Search .................................. 257/536–543, 257/749, 638, 622, 516

(56) References Cited

U.S. PATENT DOCUMENTS

| | | |
|---|---|---|
| 3,717,514 | 2/1973 | Burgess . |
| 3,990,102 | 11/1976 | Okuhara et al. . |
| 4,063,275 | 12/1977 | Matsushita et al. . |
| 4,069,487 | 1/1978 | Kasai et al. . |
| 4,217,570 | 8/1980 | Holmes . |
| 4,231,056 | 10/1980 | Taylor . |
| 4,288,776 | 9/1981 | Holmes . |
| 4,470,062 | 9/1984 | Muramatsu . |
| 4,594,265 | 6/1986 | Van Vonno et al. . |
| 4,661,202 | 4/1987 | Ochii . |
| 4,665,295 | 5/1987 | McDavid . |
| 4,708,747 | 11/1987 | O'Mara, Jr. . |
| 4,819,054 | 4/1989 | Kawaji et al. . |
| 4,823,181 | 4/1989 | Mohsen et al. . |
| 4,907,063 | 3/1990 | Okada et al. . |
| 4,980,748 | 12/1990 | Hozumi et al. . |
| 5,013,677 | 5/1991 | Hozumi . |
| 5,030,588 | 7/1991 | Hosaka . |
| 5,043,295 | 8/1991 | Ruggerio et al. . |
| 5,128,745 | 7/1992 | Takasu et al. . |
| 5,241,210 | 8/1993 | Nakagawa et al. . |
| 5,254,497 | 10/1993 | Liu . |
| 5,284,794 | 2/1994 | Isobe et al. . |
| 5,310,695 | 5/1994 | Suzuki . |
| 5,382,916 | 1/1995 | King et al. . |
| 5,420,063 | 5/1995 | Maghsoudnia et al. . |
| 5,449,946 | 9/1995 | Sakakibara et al. . |
| 5,471,084 | 11/1995 | Suzuki et al. . |
| 5,503,878 | 4/1996 | Suzuki et al. . |
| 5,525,831 | 6/1996 | Ohkawa et al. . |
| 5,552,342 | 9/1996 | Itou et al. . |

FOREIGN PATENT DOCUMENTS

| | | |
|---|---|---|
| 197 25 850 | 1/1998 | (DE) . |
| 197 48 847 | 5/1998 | (DE) . |

(List continued on next page.)

*Primary Examiner*—David Hardy
(74) *Attorney, Agent, or Firm*—Pillsbury Madison & Sutro LLP

(57) ABSTRACT

A laser trimming is favorably performed by a strengthened laser beam energy. A level difference portion having a taper portion that is oblique with respect to the thicknesswise direction of a semiconductor substrate is formed at a surface of a semiconductor substrate. An insulating film is formed thereon and has its surface made flat, and then the thin film element is formed thereon. Thereafter, laser trimming is performed with respect to the thin film resistor. As a result, a state of interference between incident laser beam and reflected laser beam reflected from the interface between the semiconductor substrate and the insulating film is varied to thereby enable the production of a zone where laser beam energy is strengthened and a zone where laser beam energy is weakened.

36 Claims, 21 Drawing Sheets

FOREIGN PATENT DOCUMENTS

| | | |
|---|---|---|
| 199388 | 10/1986 | (EP) . |
| 350961 | 1/1990 | (EP) . |
| 443575 | 8/1991 | (EP) . |
| 48-100081 | 12/1973 | (JP) . |
| 54-000384 | 1/1979 | (JP) . |
| 58-90737 | 5/1983 | (JP) . |
| 60-060753 | 4/1985 | (JP) . |
| 61-048968 | 3/1986 | (JP) . |
| 63-065641 | 3/1988 | (JP) . |
| 63-227043 | 9/1988 | (JP) . |
| 63-236343 | 10/1988 | (JP) . |
| 63-252330 | 10/1988 | (JP) . |
| 2 207 809 | 2/1989 | (JP) . |
| 2-058864 | 2/1990 | (JP) . |
| 2-58259 | 2/1990 | (JP) . |
| 2-303064 | 12/1990 | (JP) . |
| 3-8366 | 1/1991 | (JP) . |
| 3-104118 | 5/1991 | (JP) . |
| 3-110852 | 5/1991 | (JP) . |
| 3-116877 | 5/1991 | (JP) . |
| 3-148852 | 6/1991 | (JP) . |
| 4-44259 | 2/1992 | (JP) . |
| 4-44260 | 2/1992 | (JP) . |
| 4-186749 | 7/1992 | (JP) . |
| 4-239154 | 8/1992 | (JP) . |
| 5-175428 | 7/1993 | (JP) . |
| 86/04736 | 8/1986 | (WO) . |
| 91/11028 | 7/1991 | (WO) . |
| 93/06622 | 4/1993 | (WO) . |

OTHER PUBLICATIONS

A. Fischer et al: "Laser Trimming of NiCr Thin Film Resistors II: Thin film Resistors with and $SiO_2$", Protective Layer, 2194 Thin Solid Films, 182, Dec. 20, 1989, pp. 35–45.

V. Schulze et al: "Laser Trimming of NiCr Thin film Resistors I: Thin Film Resistors Without a Protective Layer", 2194 Thin Solid Films, 1982, Dec. 20, 1989, pp. 23–33.

Journal of Nippondenso Technical Disclosure, 87–023/Published on Nov. 15, 1992.

"Electronic Packaging & Interconnection Handbood", pp. 7.13–7.16, Charles A. Harper.

IBM Technical Disclosure Bulletin, "Method To Form Polysilicon Resistors Along With High–Performance Transistors", vol. 23 No. 12 May 1981, Jambot Kar.

Patent Abstracts of Japan, vol. 9, No. 53, Mar. 7, 1985, & JP–A–59 193 022.

J.C. North: "Laser Vaporization of Metal Films–Effect of Optical Interference in Underlying Dielectric Layer", Journal of Appl. Phy., vol. 48, No. 6, Jun. 1977, pp. 2419–2423.

M.J.Mueller: "Functional Laser Trimming of Thin Film Resistors on Silicon ICs", SPIE, vol. 611, Laser Processing of Semiconductors and Hybrids (1986), pp. 70–75.

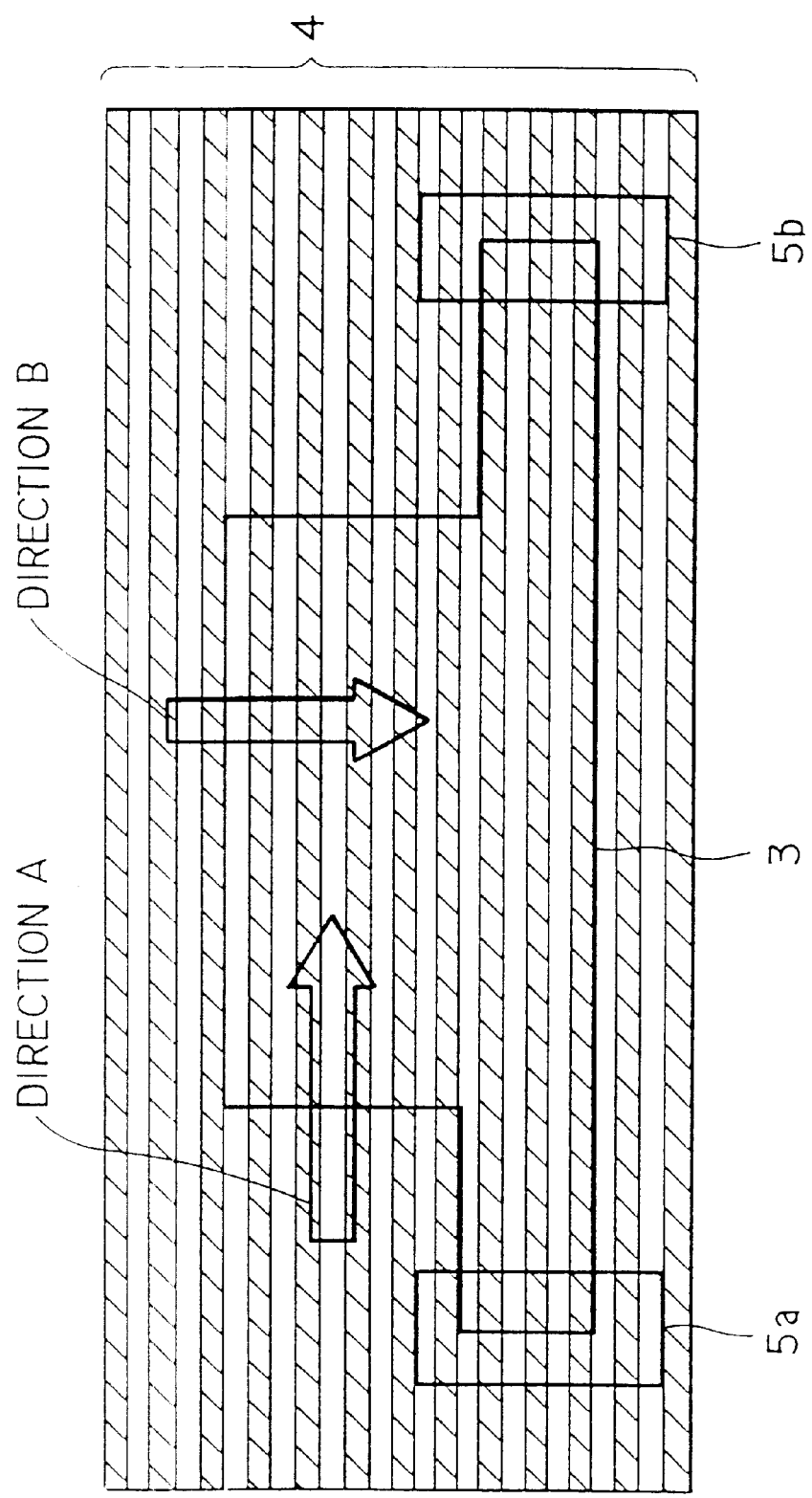

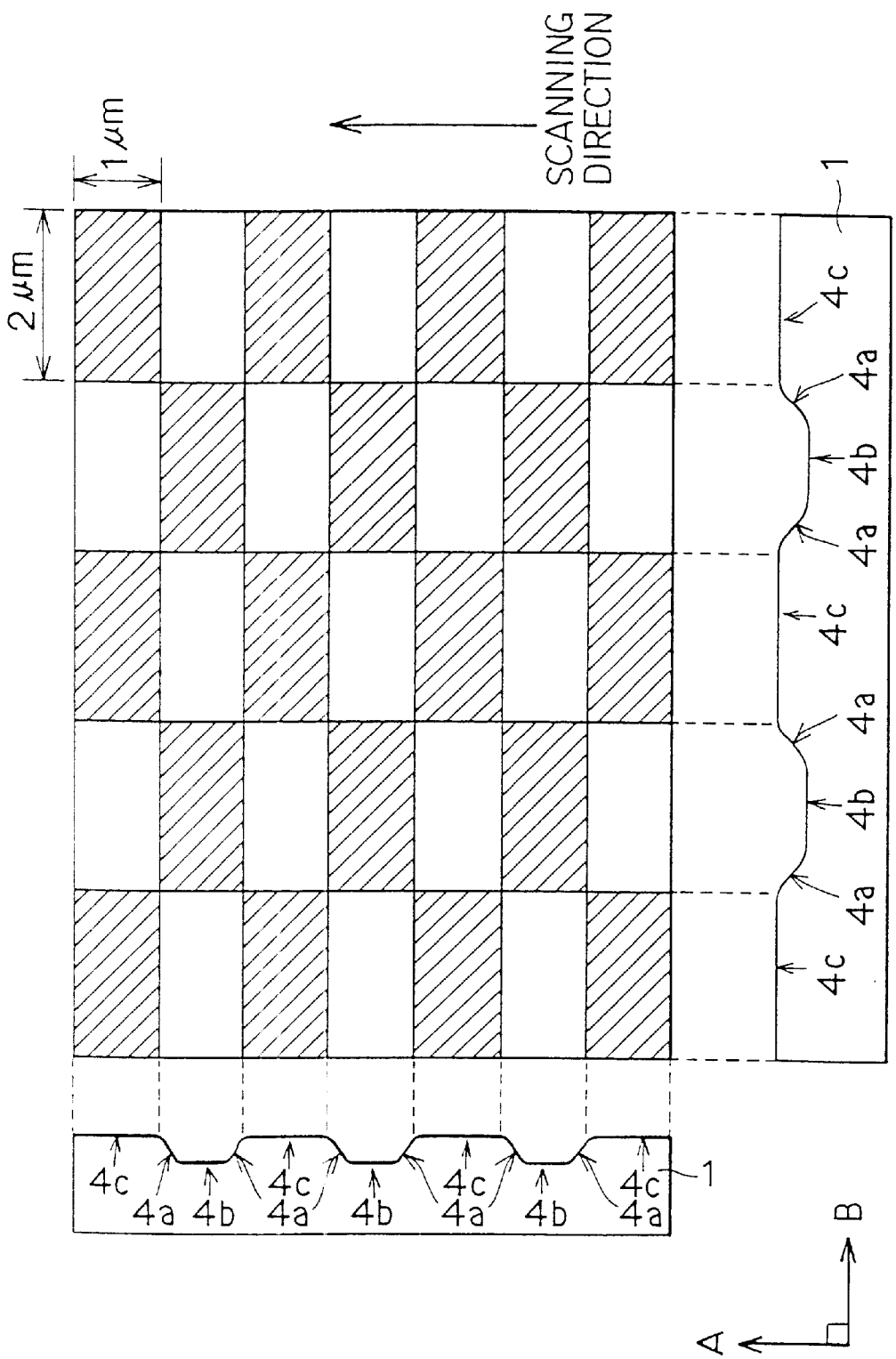

SEMICONDUCTOR DEVICE HAVING OBLIQUE PORTION AS REFLECTION

CROSS REFERENCE TO RELATED APPLICATION

This application is a continuation-in-part of U.S. patent application Ser. No. 08/885,192 filed Jun. 30, 1997, now abandoned, and is based on Japanese Patent Application Nos. Hei. 8-172366 filed on Jul. 2, 1996, and Hei. 10-138849 filed on May 20, 1998, the contents of which are incorporated herein by reference.

BACKGROUND OF THE INVENTION

1. Field of the Invention

The present invention relates generally to semiconductor devices, and more particularly to a semiconductor device that is manufactured by processes including radiating light to the semiconductor device and a semiconductor device that has a thin film element such as a resistor with respect to which trimming is performed using a laser beam.

2. Description of the Related Art

There is a known laser trimming method in which a resistor material such as CrSi is deposited on a semiconductor substrate through an insulating material or the like, and patterning is performed thereon. Subsequently, a prescribed pattern, and then a laser beam is radiated onto the resulting thin film resistor to thereby fuse a part thereof and set its resistance value to a desired value.

In the above laser trimming, the laser beam radiated onto the thin film resistor transmits through the thin film resistor, and is reflected by an interface between an underlying oxide film layer and the semiconductor substrate that interferes with the incident laser beam. Due to this interference, stable trimming of the thin film resistor is impossible to perform.

U.S. Pat. Nos. 4,594,265 and 4,708,747 disclose techniques which solve this problem. Each of these techniques concerns a semiconductor device wherein respective semiconductor layers are electrically isolated by providing an isolating insulative film within a semiconductor substrate. Further, an insulating layer is formed on the surface of the semiconductor substrate and a thin film resistor is formed thereon. In the former technique, indentures or V-grooves are formed by etching or the like in the surface of the semiconductor layer located at the interface between the isolating insulative film within the semiconductor substrate and the semiconductor layer to thereby prevent the laser beam reflection from the interface between the isolating insulating film within the semiconductor substrate and the semiconductor layer. In the latter technique, the laser beam reflection is prevented by controlling the thickness of the isolating insulative film to a value that permits this isolating insulative film to become "transparent" with respect to the laser beam.

However, in the techniques disclosed in the above Patents, no consideration is given to the transmission light of the laser beam that is reflected by the interface between the insulating layer right under the thin film resistor that has been formed on the semiconductor substrate and the surface of the semiconductor substrate.

The Journal of Nippondenso Technical Disclosure No. 87-023 (published Nov. 15, 1992), as shown in FIG. 16 discloses a countermeasure. The countermeasure technique use a thin film resistor 3 formed on an Si substrate 1 with an insulating layer 2 interposed therebetween. Further, at an interface between the Si substrate 1 and the insulating layer 2 located under the thin film resistor 3, there is provided a level difference portion A having a height corresponding to ¼ of the laser beam wavelength to thereby cause the laser beams reflected by upper portions and lower portions of concavities and convexities in the level difference portion A to cancel one another. As a result, the incident laser beam and reflected laser beam are prevented from interfering with each other in the vicinity of the thin film resistor. This enables laser trimming to be performed with a high degree of precision.

However, in this technique, precise control of the height of the top portion and the bottom portion defined by the concavities and convexities of the level difference portion is required to cancel the interference due to the reflected laser beam.

On the other hand, the laser trimming is performed by using an alignment mark. A second Al (second Al wire layer), which is maintained on a scrub line between chips, has been used as the alignment mark.

However, since it has recently been desire to reduce the scrub line, level difference portions are generated at both sides of the scrub line. In this situation, it has been found that the alignment may be shifted, because the process becomes difficult. A surface roughness is generated due to etching remains or over-etching, and a reflection intensity of the laser beam radiated to the alignment recognition is influenced.

A reason for the above-mentioned alignment shift will be explained in detail. FIG. 21A shows a sectional view of the element in which an alignment mark 52 is formed on a scrub line of an SOI substrate 51. As shown in FIG. 21B, when a laser beam is radiated to around a second Al as the alignment mark 52, a reflection intensity is high at the second Al, while the reflection intensity is low at surrounding area of the second Al. That is, the second Al reflects the laser beam largely because the second Al does not transmit the laser beam, while the surrounding area does not provide a large amount of reflection. Therefore, the alignment mark 52 can be recognized precisely based on a difference of the reflection intensities when the laser beam is radiated thereto.

However, when the surface roughness is generated, since the reflection intensity may vary within a range of 0–80% (see the arrows in the figure), the alignment may not be precisely recognized.

Here, the alignment mark for trimming may be disposed in a ship instead of on the scrub line, where the recognition of the alignment mark is difficult to improve the recognizablity of the alignment mark and to secure a disposition space of the alignment mark for trimming.

Furthermore, a stepper method has been recently utilized to secure an efficient chip number. In the stepper method, data such as a photography alignment mark for a photography or TEG pattern is disposed on the scrub line. Therefore, it becomes difficult to secure the disposition space of the alignment mark for trimming on the scrub line. Hence, it would be effective to dispose of the need for the alignment mark in the chip.

However, in such a case, as shown in FIG. 22A, which is a sectional view of the element that the alignment mark is disposed in the chip, an internal structure of the chip may become complicated. That is, the element includes insulating films 61, 62 formed by, for example, as a TEOS film or a P—SiN as an interlayer insula ting films, an insulating film 63, a BPSG film 64, Si film 65 that constitutes an Si substrate, a buried $SiO_2$ 66 which are laminated on the Si substrate 67 below the second Al 60. Therefore, as shown in FIG. 22B, the reflection intensity around the surrounding area of the second Al 60 may vary due to a thickness variation of the films 61–67.

Therefore, it may not be possible to improve t he recognizablity of the alignment mark or may not be possible to secure the disposition space of the alignment mark for trimming.

SUMMARY OF THE INVENTION

Accordingly, it is an object of the present invention to provide a semiconductor device in which a thin film resistor can be laser-trimmed with a high degree of precision without precise control of a height of a top portion and a bottom portion of a level difference portion, and a method for manufacturing the same.

Furthermore, another object of the p resent invention is to provide a semiconductor device in which an alignment mark for trimming can be detected with a high degree of precision when such the alignment mark is disposed in a chip, and a method for manufacturing the same.

The present invention solves at least one of the above-mentioned problems in a semiconductor device formed therein a thin film resistor that needs to be laser trimmed. Specifically, at an interface between an insulating layer that is located beneath the thin film resistor and a semiconductor substrate, region that is oblique with respect to a thickness-wise direction of a semiconductor substrate is formed so that the laser beam that has been radiated onto and has transmitted through the thin film resistor is reflected by the oblique region to reach the thin film resistor.

Due to the reflected laser beam from the oblique region, the interference between the reflected laser beam and the incident laser beam becomes complicated unlike a case where the interface between the insulating layer and the semiconductor substrate is flat. Due to an interference light obtained by the interference there between, a zone where the laser beam energy is strengthened necessarily exists in a region where the thin film resistor exists. Accordingly, trimming thereof can be performed with great precision with great precision. That is, the present invention performs trimming of the thin film resistor not by preventing the reflection of laser beam at the interface between the insulating layer and the semiconductor substrate as in the prior art, but by using the reflection thereof at the interface therebetween.

Accordingly, since there is no need to cancel the reflected laser beam as in the prior art, it is not necessary to strictly control the height of the top portion and the bottom portion of the level difference portion constituted by the concavities and convexities in order to cancel the reflected laser beam. It is sufficient to vary, by the oblique region formed in the interface between the insulating layer and the semiconductor substrate, a state of interference between the incident laser beam and the reflected laser beam from the interface therebetween. Also, according to the present invention, it is possible to perform trimming excellently without being influenced by the thickness of the insulating layer.

Preferably, the oblique region is set to be at an angle that is larger than 45° and smaller than 90° with respect to the thicknesswise direction of the semiconductor substrate. As a result, the laser beam that has transmitted through the thin film resistor is reflected by the oblique region to reach the thin film resistor reliably.

Also, the oblique region may be formed to be curvilinear. This results in the laser beam that has transmitted through the thin film resistor being reflected at various angles by the oblique region that has been made curvilinear. Accordingly, it is expected that a zone where the incident laser beam and the reflected laser beam act together so as to strengthen their opponent energies due to the interference therebetween and a zone where they both act together to weaken their opponent energies due thereto are alternately produced in the vicinity of the surface of the semiconductor device.

Also, if a top portion and a bottom portion (i.e., a level difference portion) are each formed between the oblique regions, the laser beam that has transmitted through the thin film resistor causes the above-mentioned variations in the interference laser beam by being reflected by the top/bottom portions of the level difference portion as well as the oblique regions.

Preferably, at least either of connection portions between the oblique regions and the adjoining top portions of the level difference portion and connection portions between the oblique regions and the adjoining bottom portions thereof are formed to be curvilinear and smooth. In this case, the laser beam that has transmitted through the thin film resistor is reflected at various angles by the smoothed curvilinear connection portions. Accordingly, it is also expected that the zone where the incident laser beam and the reflected laser beam act together to strengthen their opponent energies and the zone where they both act together to weaken their opponent energies are alternately produced in the vicinity of the surface of the semiconductor device.

Also, if the oblique regions are arranged so that a plurality of the oblique regions exist within the spot size of the radiated laser beam, the zone where the incident laser beam and the reflected laser beam act together to strengthen their opponent energies exists more reliably in the region where the thin film resistor is formed. As a result, the thin film resistor can be trimmed more reliably.

The oblique region may be formed by using a selective oxidation film. By forming the oblique region with the use of the selective oxidation film, it is possible to form a smooth surface in the oblique region which is suitable for reflection of a laser beam. Also, since the formation of the oblique region can be performed simultaneously with the formation of the selective oxidation film for isolating an element region such as a transistor region formed in the semiconductor substrate, it is possible to form the oblique region without causing an increase in the number of the manufacturing steps.

Also, the oblique regions may be disposed in the form of stripes, or may be disposed in the form of meshes wherein stripes cross each other. In a case where the oblique regions are disposed in the form of meshes, the top and bottom portions of the level difference portion are alternately disposed between the oblique regions.

It is to be noted that according to the experiments performed by the present inventors, when a comparison is made between a case where a laser beam is radiated with respect to the oblique regions formed in stripes in such a way as to cross the stripes vertically and a case where a laser beam was radiated with respect thereto in such a way as to be in parallel with the stripes, radiation of a laser beam in the parallel direction enables excellent trimming to be performed. On the other hand, the radiation of a laser beam in the vertical direction resulted in that trimming could not be performed as well.

Accordingly, when the oblique region and the level difference portion are alternatively disposed in the form of the stripe, by radiating a laser beam to the oblique region and the level difference portion in parallel with the stripe, it is possible to perform excellent trimming.

Also, in the trimming of the thin film resistor, a method of performing trimming not by setting the scanning direction of laser beam to be at one direction but by turning the scanning direction thereof in such a way as a letter "L" (hereinafter referred to as "an 'L-letter' cut"). Accordingly, in a case where the oblique regions have been formed in the stripe, it happens that the 'L-letter' cut cannot be performed excellently.

However, according to the experiments performed by the present inventors, it has been discovered that when the level difference portion formed between the oblique regions have been disposed in meshes, it is possible to perform stable trimming as well. Accordingly, if the top and bottom portions of the level difference portion are disposed alternately, the 'L-letter' cut can be performed excellently.

BRIEF DESCRIPTION OF THE DRAWINGS

Other features and advantages of the present invention will be appreciated, as well as methods of operation and the function of the related parts, from a study of the following detailed description, the appended claims, and the drawings, all of which form a part of this application. In the drawings:

FIG. 11 is a view illustrating the relation the scanning directions of a laser beam and a level difference portion 4;

FIG. 12 is a view illustrating the level difference portion 4 of which level differences are arranged in the form of meshes;

DETAILED DESCRIPTION OF THE PREFERRED EMBODIMENTS

Embodiments of the present invention will now be explained with reference to the drawings.

(First Embodiment)

Figure 1:
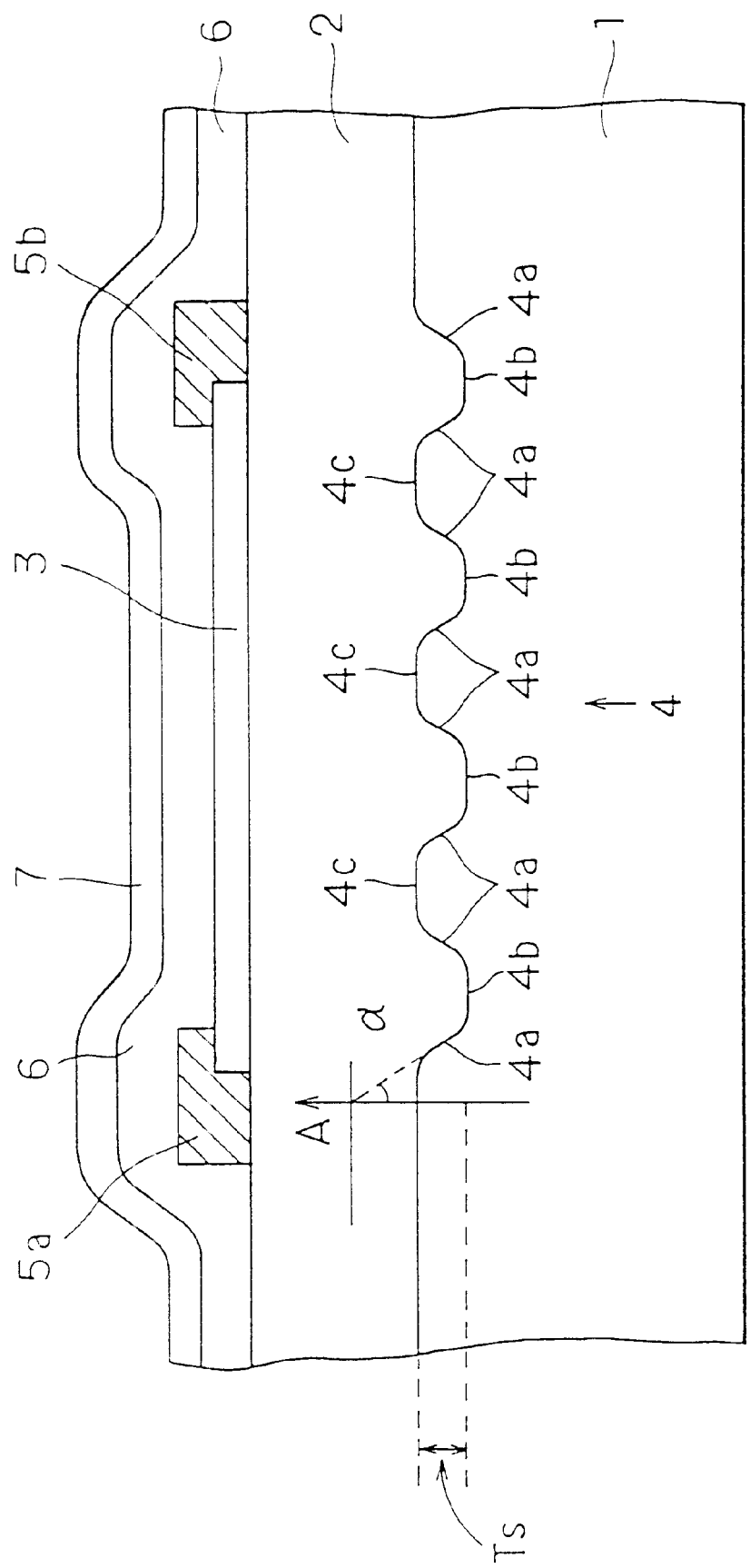
FIG. 1 is a sectional view illustrating a semiconductor device according to a first embodiment of the present invention.

FIG. 1 is a sectional view illustrating a semiconductor device according to a first embodiment of the present invention.

In the semiconductor device illustrated in FIG. 1, a level difference portion 4 (trapezoidal level difference portion) is formed in a surface of a semiconductor substrate 1 that consists of silicon. An insulating film 2 such as a BPSG film containing boron (B) or phosphorus (P) is deposited on the semiconductor substrate 1. Further, on the insulating film 2 of which surface has been flattened there is formed a thin film resistor 3 such as CrSi. Also, on both end portions of the thin film resistor 3 there are respectively formed Al electrodes 5a and 5b and then an insulating film 6 such as an oxide film and a protective film 7 such as a nitride film (SiN) are formed in such a way as to cover the surfaces of the Al electrodes 5a, 5b and thin film resistor 3.

The level difference portion 4 has taper portions 4a (also called "oblique regions" or "oblique sides") that connect bottom portions 4b and top portions 4c of the level difference portion 4. Each of these taper portions 4a is formed to define an angle of with respect to the thicknesswise direction of the semiconductor substrate 1 that is indicated by an arrow A in FIG. 1. When trimming is performed, a laser beam that has transmitted through the thin film resistor 3 is reflected by the taper portions 4a and again reaches the thin film resistor 3. It is to be noted that the angle is set to be $45°<\alpha<90°$ for the laser beam transmitted through the thin film resistor 3 to be reflected upward. Preferably, the angle is set to be $50°\leq\alpha\leq70°$. Further, it is to be noted that the plane orientation of the semiconductor substrate 1 is the (100) plane.

Comparing a case where trimming has been performed with respect to this semiconductor device and a case where trimming has been performed with respect to the conventional semiconductor device having no level difference portion 4 formed therein, the effects the level difference portions 4 has on the trimming operation will be explained based on experimental results.

Figure 2:
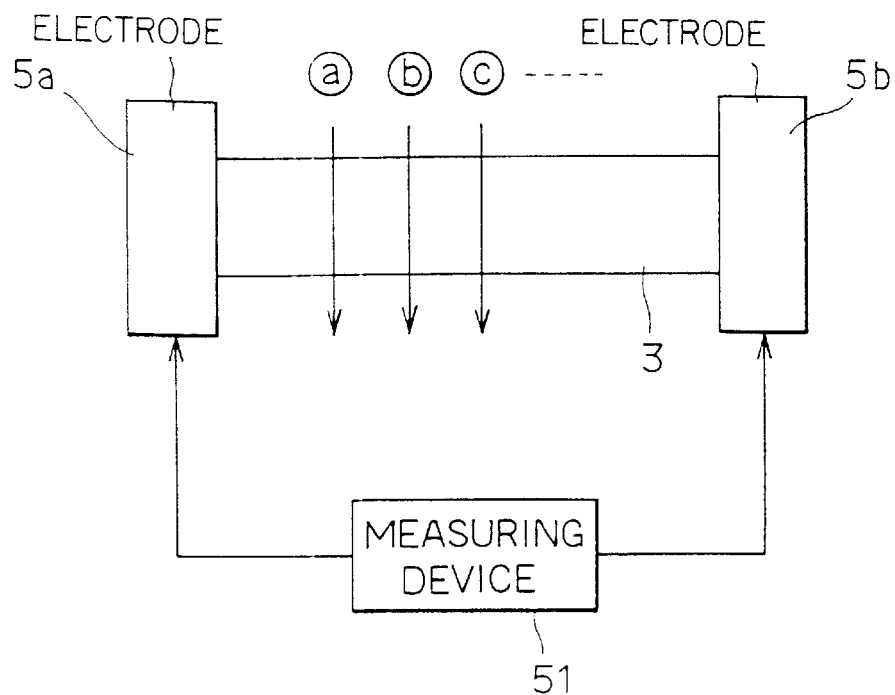
FIG. 2 is a drawing illustrating a measuring test for measuring trimming energy.

In the experiment, a plurality of samples were prepared wherein the thicknesses of the insulating film 2 located under the thin film resistor 3 were different from one another. As illustrated in FIG. 2, between the Al electrodes 5a and 5b there was connected a measuring device 51 for measuring the resistance value between the electrodes 5a and 5b. Laser beam radiation was performed while the laser beam was scanned as indicated by arrows (a), (b), (c), - - - in the figure while the output thereof was being varied. The laser beam output was detected when the resistance value exhibited by the measuring device 51 became infinite, i.e., when the thin film resistor 3 was fused by laser beam radiation with the result that the state between the Al electrodes 5a and 5b became open. It is to be noted that FIG. 2 is a plane view of the semiconductor device having the thin film resistor 3 formed therein, as seen from above.

Incidentally, the device which was used in the experiment was a trimming device produced by The Esi CORP.; the laser was a YLF laser that had a wavelength $\lambda$ of 1.048 $\mu$m; and a pulse laser beam of which radiation pulse width was approximately 50 ns and of which pulse interval was 1.3 ms was used. Also, the spot size of the laser beam that was radiated on the CrSi film 3 was set to be 10 $\mu$m.

Figure 3A:
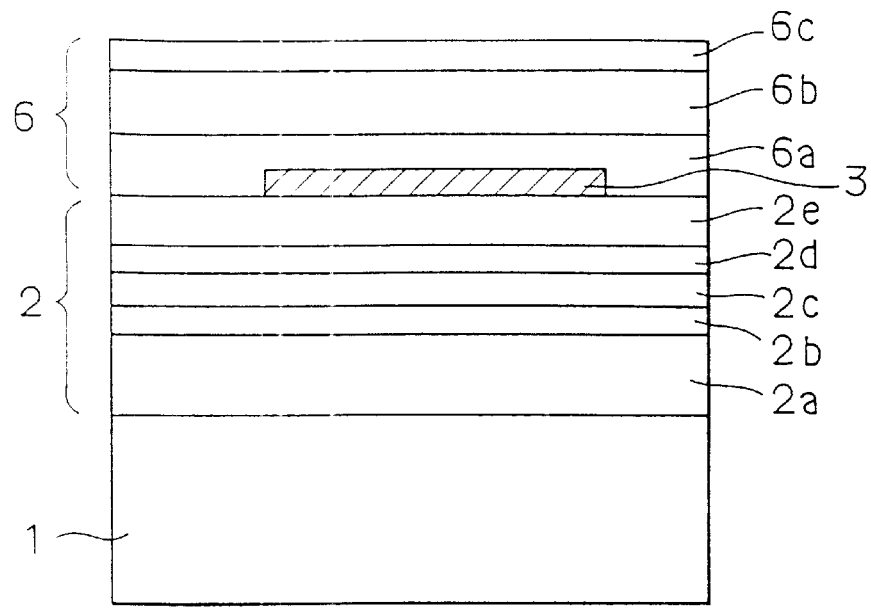
FIG. 3A is a sectional view illustrating a conventional sample that was used for an experiment.
Figure 3B:
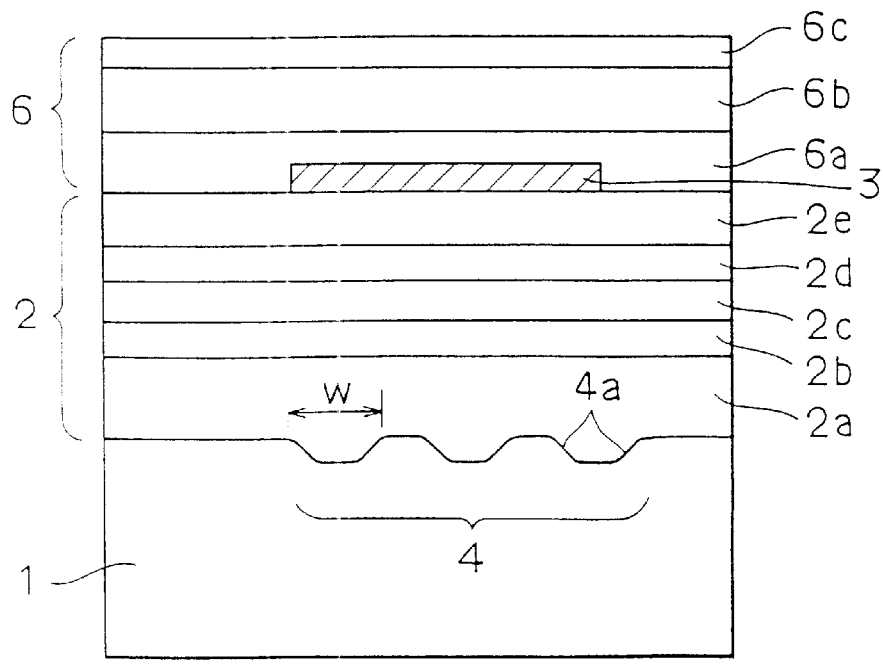
FIG. 3B is a sectional view illustrating a sample according to the first embodiment that was used for the experiment.

FIGS. 3A and 3B are detailed sectional views illustrating the samples that were used in the experiment. In each of the samples, the insulating film 2 located under the thin film resistor 3 is composed of a BPSG film 2a, a P—SiN film 2b formed by plasma CVD (Chemical vapor Deposition), a TEOS film 2c formed using a Tetraethyloxysilane gas, an SOG (Spin-On-Glass) film 2d and a TEOS film 2e. The insulating film 6 located over the thin film resistor 3 is composed of a TEOS film 6a, P—SIN film 6b and TEOS film 6c.

FIG. 3A illustrates the conventional semiconductor device wherein the interface between the semiconductor substrate 1 and the insulating film 2 located under the thin film resistor 3 is flat, and FIG. 3B illustrates the semiconductor device wherein the level difference portion 4 having the taper portions 4a illustrated in FIG. 1 has been provided at the interface between the semiconductor substrate 1 and the insulating film 2 located thereunder.

Also, in the semiconductor device according to the first embodiment used in the experiment, the top portions of the level difference portion 4 illustrated in FIG. 3B have been formed with the interval W being set to be 2 $\mu$m.

In the experiment, there was examined the laser beam output (laser beam energy) that enabled trimming to be performed when the thickness of the BPSG film 2a in FIGS. 3A and 3B was varied from 4000 Å to 7000 Å.

Figure 4:
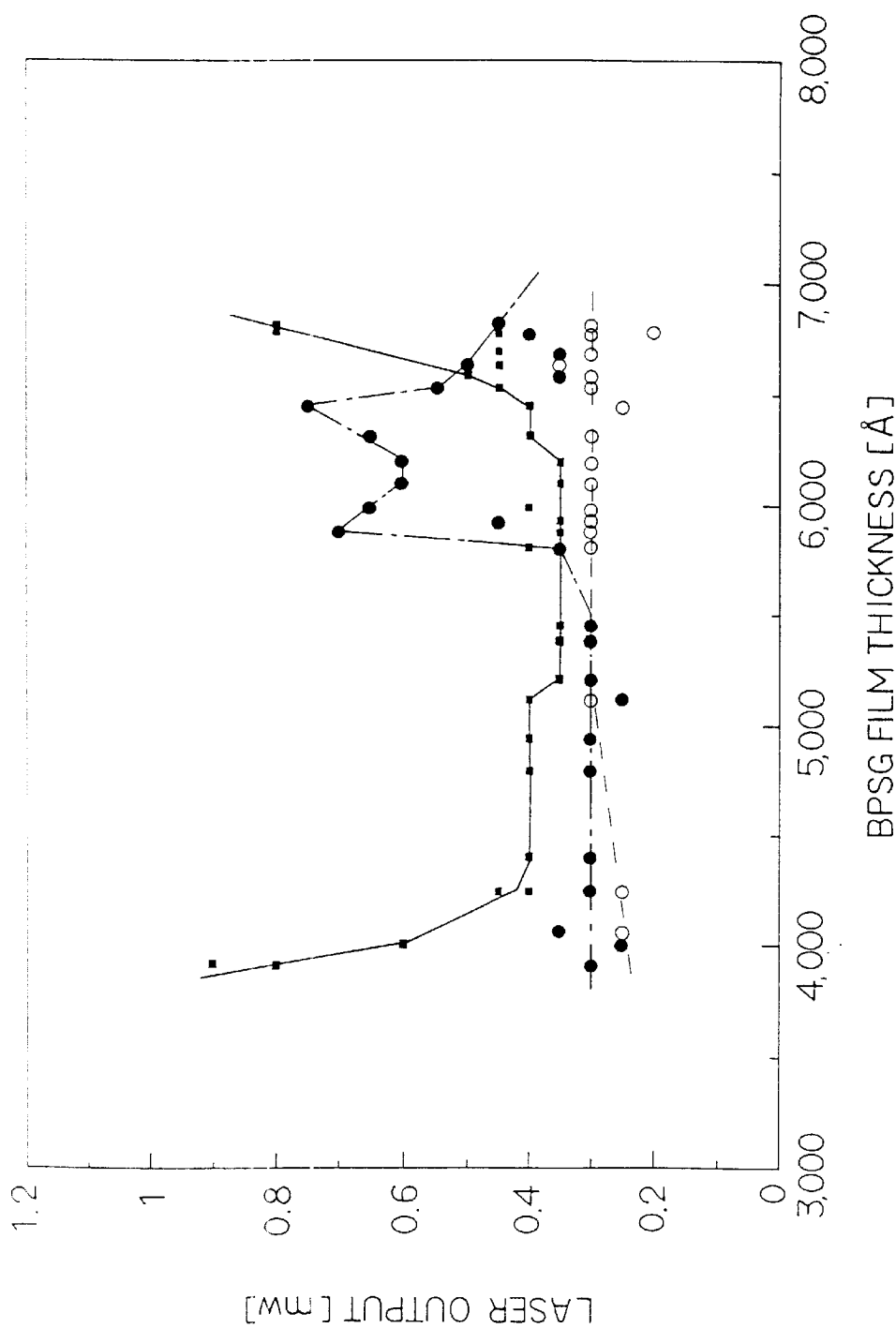
FIG. 4 is a graph illustrating the measured results of the trimming energy.

The experimental results are illustrated in FIG. 4. The mark ■ in the figure indicates the measured values that were obtained from the conventional semiconductor device illustrated in FIG. 3A and the mark ○ indicates the measured values that were obtained from the semiconductor device according to the first embodiment illustrated in FIG. 3B. It is to be noted the mark ● will be explained later.

As will be also understood from FIG. 4, in the conventional semiconductor device, when the thickness of the BPSG film 2a is at around 4000 Å and at around 7000 Å, the laser beam output that is needed for trimming becomes larger than that which is needed therefor when this thickness is at each of the remaining values, exceeding 0.8 mW which is the laser beam output that causes breakage of the protective film 7. On the other hand, in the semiconductor device according to the first embodiment, it is understood that even when the thickness of the BPSG film 2a is varied, the laser beam output that is needed for trimming is stably at around 0.3 mW with a high degree of precision of the trimming. This will be explained in more detail below based on the results that have been obtained by simulation.

In FIGS. 5A and 5B and FIGS. 6A and 6B there are illustrated the results examined by simulation on the states of interference of a laser beam that occurs in a conventional case where the interface between the insulating film 2 and the semiconductor substrate 1 is flat and in a case where the interface therebetween has the oblique regions 4a.

Figure 5B:
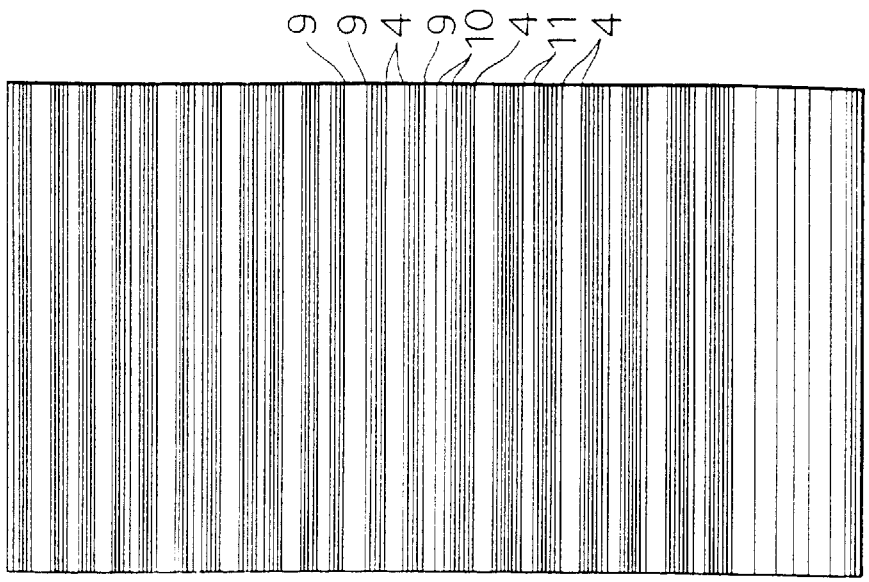
FIG. 5B is a view illustrating a state of interference of laser beam that occurs when the semiconductor device has the structure of FIG. 5A.
Figure 5A:
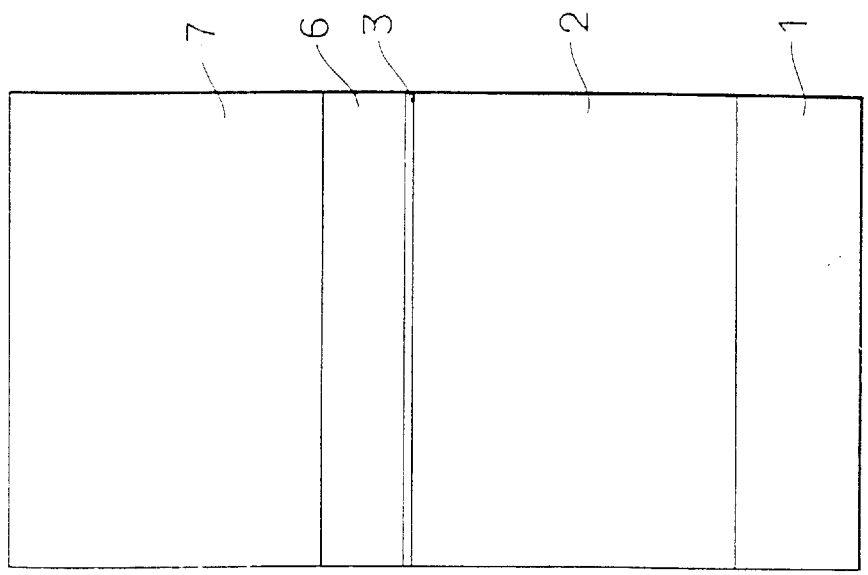
FIG. 5A is a sectional view illustrating a semiconductor device having a conventional structure.
Figure 6A:
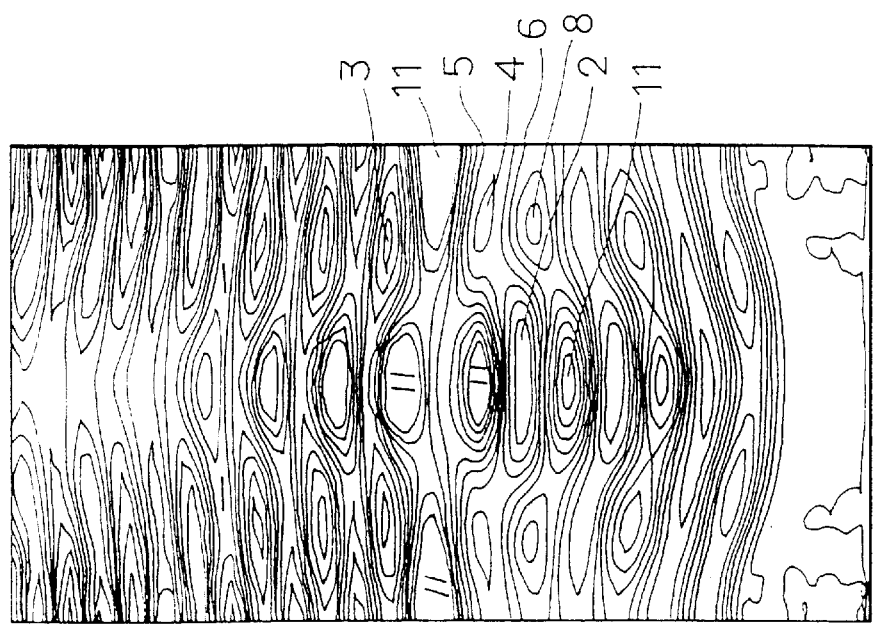
FIG. 6A is a sectional view illustrating a semiconductor device having a structure according to the first embodiment.

FIGS. 5A and 6A illustrate respective parts of the sections of the semiconductor devices each having the semiconductor substrate 1 which consists of Si and on which there are sequentially formed the insulating film 2, thin film resistor 3 consisting of CrSi, insulating film 6 and protective film 7. It is to be noted that in FIG. 6A the lateral width W of the simulation model is 2 $\mu$m, which is the same as the interval of the level difference portion 4 of FIG. 3B. The state of interference of laser beam that occurs when the laser beam having a wavelength of 1.048 $\mu$m has been radiated on each of these semiconductor devices are illustrated in FIGS. 5B and 6B.

Figure 6B:
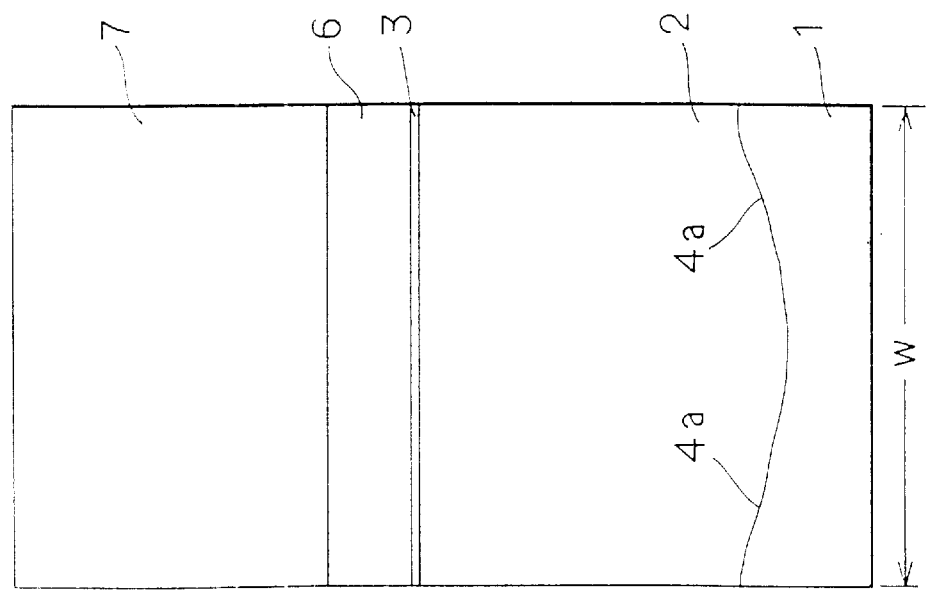
FIG. 6B is a view illustrating a state of interference of laser beam that occurs when the semiconductor device has the structure of FIG. 6A.

In FIGS. 5B and 6B, the areas each having the same laser beam energy as a result of the interference of the laser beam are indicated by contour lines and the numerals in the figures represent the laser beam energy strengths that occur as a result of such interference.

In FIG. 5B, because the surface of the semiconductor substrate 1 is flat, interference stripes are produced in parallel with the surface of the semiconductor substrate 1. That is, in the thicknesswise direction of the device illustrated in FIG. 5A, there alternately appear the zones where the incident laser beam and the reflected laser beam act together to strengthen their opponent energies and the zones where the both act together to weaken their opponent energies. Accordingly, in this case, if the zone where laser beam energy is weakened by the interference light is produced, trimming of the thin film resistor 3 becomes impossible to perform. Accordingly, in this case, whether or not the trimming can be performed is inconveniently influenced by the thickness of the insulating film 2 located under the thin film resistor 3. However, ever if at this time the output of the laser beam is made larger the trimming is possible. The increase in the laser beam output is limited because making the laser beam output too large gives rise to the breakage of the insulating film and the like.

On the other hand, in FIG. 6B, there are produced interference stripes that are different from those which are produced in FIG. 5B. More specifically, there alternately appear the zones where the incident laser beam and the reflected laser beam strengthen one another in terms of their energies and the zones where they both weaken one another in terms of their energies in a direction perpendicular to the thicknesswise direction of the semiconductor device of FIG. 6A, i.e., in the lateral direction of FIG. 6A. Accordingly, in this case, in the position of the thin film resistor 3, zones where laser beam energy is strengthened by the interference of laser beam are necessarily produced. As a result, accurate and reliable trimming of the thin film resistor 3 becomes possible.

That is, the semiconductor device of FIGS. 5A and 5B have the conventional structure. In the thicknesswise direction (the direction A indicated in FIG. 1) of the semiconductor device the zones alternately appear where the laser beam energy is strengthened by interference of laser beam and the zones alternately appear where the laser beam energy is weakened thereby. Thus cases developed in which trimming can be performed and where trimming cannot be performed according to the thickness of the insulating film 2 located under the thin film resistor 3. However, in this embodiment, due to the taper portions 4a illustrated in FIG. 1 being formed at the interface between the semiconductor substrate 1 and the insulating film 2 there are produced the zones where laser beam energy is strengthen by interference of the incident laser beam and the reflected laser beam and the zones where laser beam energy is weakened thereby, not only in the thicknesswise direction of the semiconductor device but also in the lateral direction thereof that is perpendicular to this thicknesswise direction. Therefore, within the region where the thin film resistor 3 is formed, there necessarily exist the zones where laser beam energy is strengthened, whereby trimming can be reliably performed.

Figure 7:
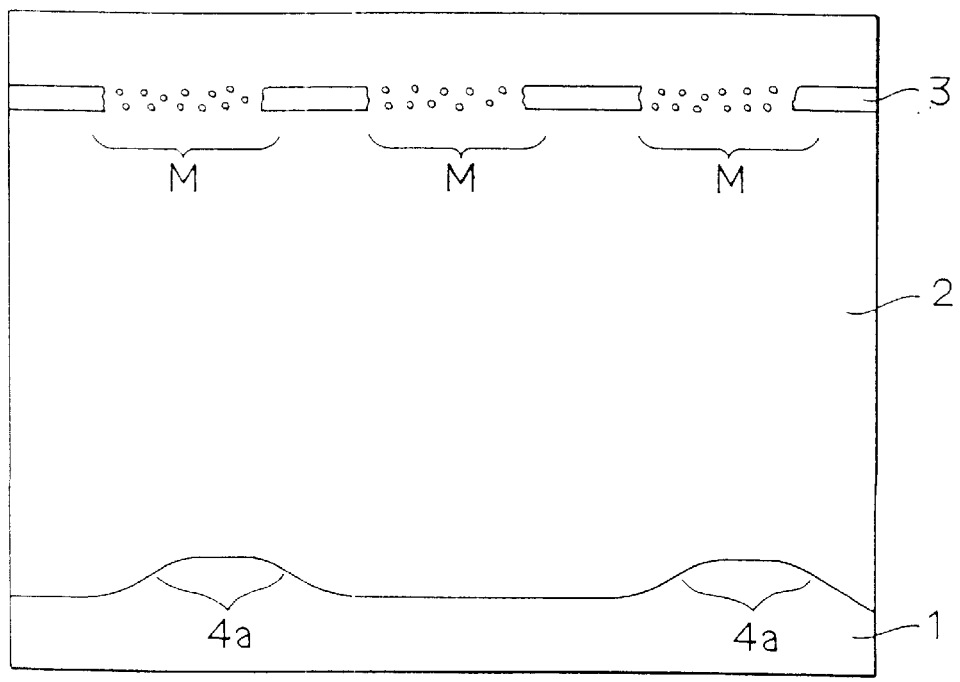
FIG. 7 is a view illustrating a transmission type electronic microscope image of a section of a semiconductor device after trimming has been performed.

Next, in FIG. 7 there is presented a sectional view illustrating a transmission type electronic microscope (TEM) image of the cross section of the semiconductor device that has been obtained after the thin film resistor 3 has been trimmed.

In FIG. 7, the thin film resistor 3 has been trimmed with the use of a laser beam energy having a magnitude of approximately 0.2 $\mu$J which is a minimum, or around a minimum, value enabling the thin film resistor 3 to be trimmed. The regions, each of which is indicated by M FIG. 7, are ones wherein the thin film resistor 3 has been fused. It is understood from this figure that the thin film resistor 3 is actually fused at certain intervals in the lateral direction. It is considered that, in the regions indicated by M in FIG. 7, laser beam energy is strengthened as illustrated in FIG. 6B and therefore the thin film resistor 3 has been fused.

Figure 8:
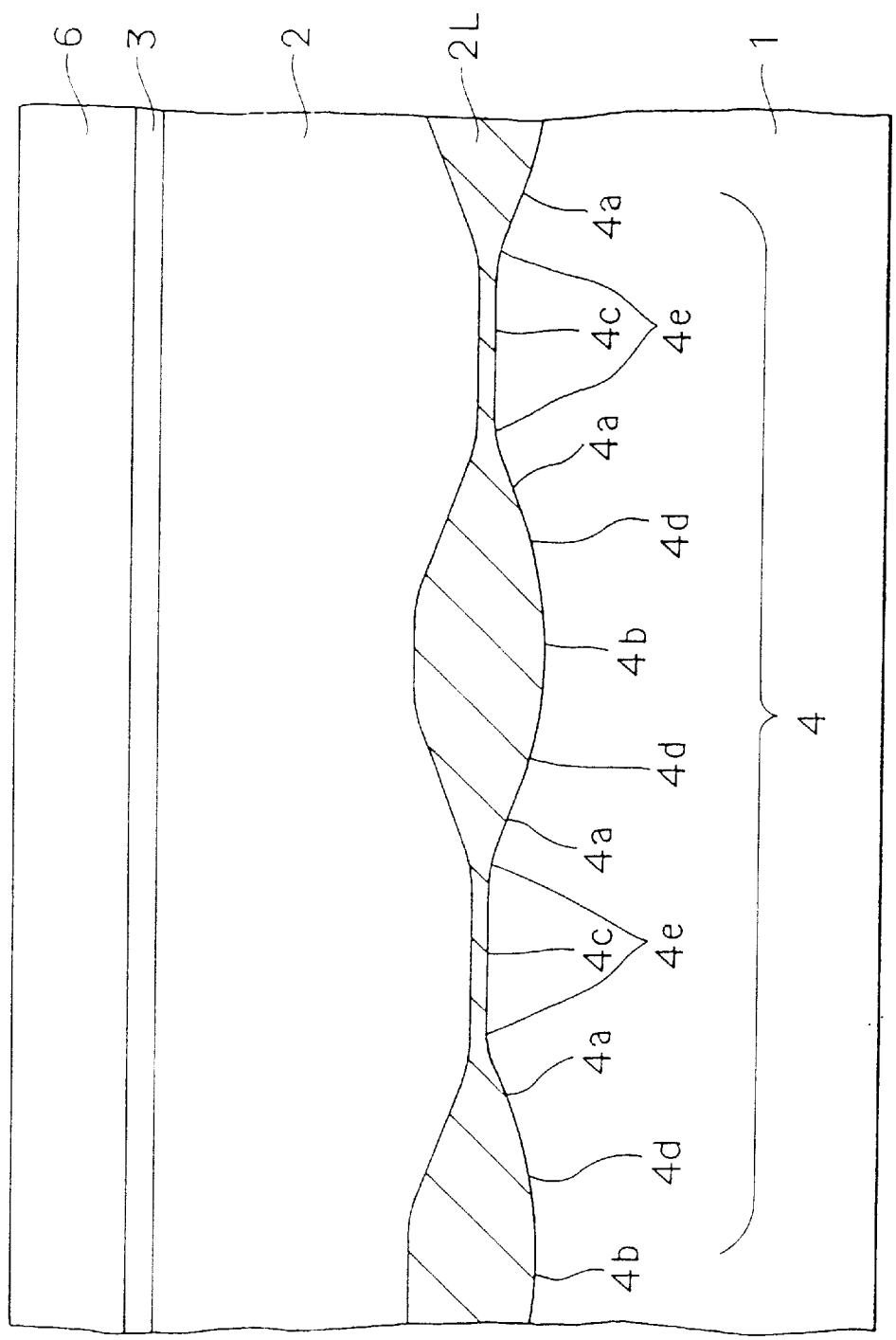
FIG. 8 is a view illustrating a transmission type electronic microscope image of a section of a semiconductor device according to the first embodiment.

Next, in FIG. 8 there is presented a view illustrating a scan type electronic microscope (SEM) image of the cross section of the semiconductor device. In this embodiment, the level difference portion 4 is formed by forming the LOCOS oxide film 2L. In FIG. 8, the taper portion 4a is made curvilinear, a connection portion 4d that connects the taper portion 4a and a bottom portion 4b of the level difference portion 4 is also made curvilinear and gentle, and the bottom portion 4b itself is also curved in such a way as to be contiguous to the connection portion 4d. That is, a recessed portion (constituted by the taper portion 4a, bottom portion 4b and connection portion 4d) that is formed by the LOCOS oxide film 2L is formed to be curved. Also, a connection portion 4e that connects the taper portion 4a and a top portion 4c of the level difference portion 4 is curvilinear gradual.

It is considered that the distribution of laser beam energy that has been illustrated in FIG. 6B is also brought by the taper portion 4a, bottom portion 4b and top portion 4c of the level difference portion 4. In addition, as illustrated in FIG. 8 the laser beam that has transmitted through the thin film resistor 3 is reflected by the taper portion 4a that is made curvilinear in directions that are bit by bit different from one another according to the reflected positions thereof. As a result, it is considered that such reflection also contributes to the achievement of the distribution of laser beam energy. Similarly, it is considered that the connection portion 4d between the taper portion 4a and the bottom portion 4b or the connection portion 4e between the taper portion 4a and the top portion 4c also contributes to the achievement of the distribution of laser beam energy. In other words, the distribution of laser beam energy is achieved by the recessed portion that has been formed to be curved by the LOCOS oxide film 2L.

As mentioned above, in the semiconductor device according to the first embodiment, the state of interference between the incident laser beam and the reflected laser beam is varied as stated above so as to enable trimming of the thin film resistor. This is accomplished not by eliminating the reflection light of a laser beam at the interface between the insulating film and the semiconductor substrate as in the prior art but by utilizing the reflection light of a laser beam at this interface.

Accordingly, since there is no need to eliminate the reflected laser beam as in the prior art, there is no need to strictly control the height (Ts in FIG. 1) of the level difference portion 4 in order to prevent the generation of the reflected laser beam. In the first embodiment, it is sufficient to vary, by the taper portions 4a formed at the interface between the insulating film and the semiconductor substrate, the state of interference between the incident laser beam and the reflected laser beam that is reflected by the interface.

(Second Embodiment)

Next, a second embodiment wherein laser trimming is performed with respect to a semiconductor device that uses a semiconductor substrate 11 called "an SOI (Silicon On Insulator) substrate" such as that illustrated in FIGS. 9A and 9B, within which an oxide film layer ($SiO_2$ layer 11b) has been formed, will be explained.

Figure 9A:
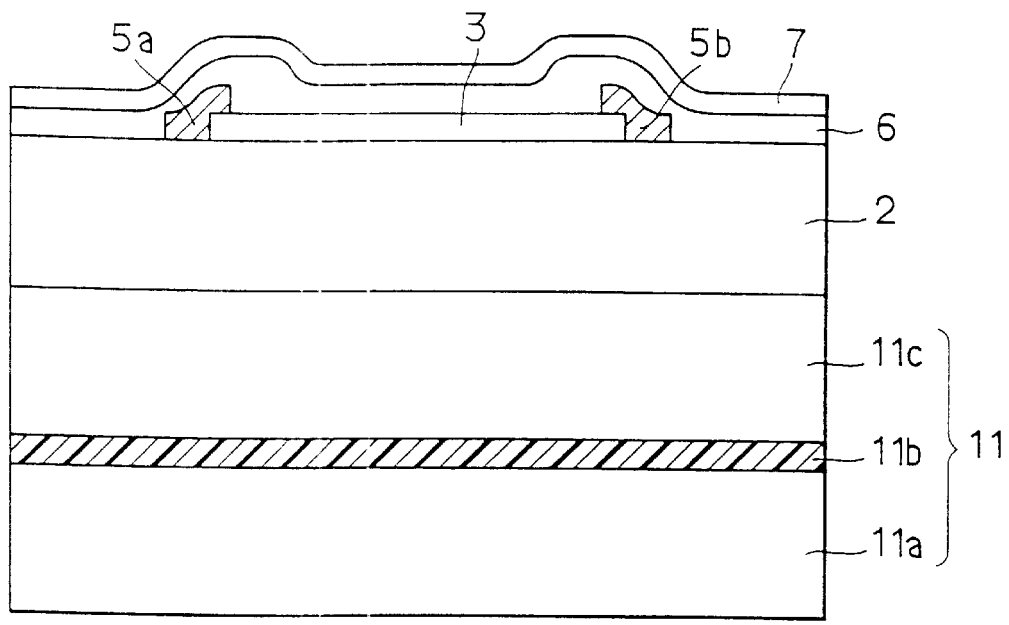
FIG. 9A is a sectional view illustrating a sample having a conventional structure that was used for an experiment.

In the case of using the semiconductor substrate 11 illustrated in FIG. 9A, the interference between the incident laser beam and the reflected laser beam that are reflected from the interfaces between an $SiO_2$ layer 11b and an Si layer 11c (wherein the plane orientation is the (100) plane) located thereover and between the $SiO_2$ layer 11b and a semiconductor substrate 11a located thereunder becomes problematic when trimming is performed.

Figure 9B:
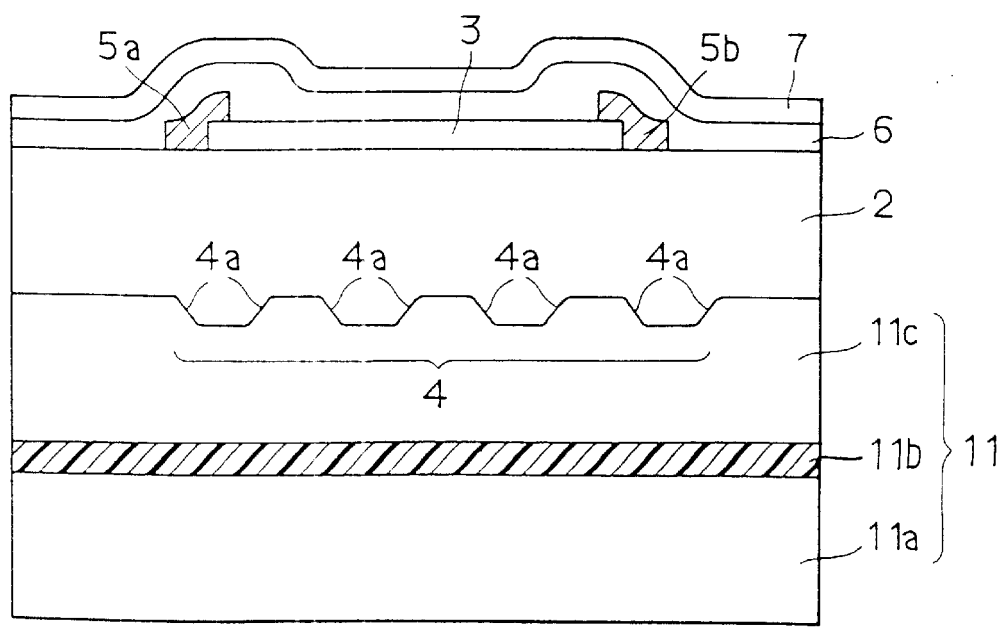
FIG. 9B is a sectional view illustrating a sample according to a second embodiment that was used for the experiment.

FIG. 9A shows the conventional semiconductor device wherein the surface of the semiconductor substrate 11 is flat and FIG. 9B shows the semiconductor device according to the second embodiment wherein the surface of the semiconductor substrate 11 has a level difference portion 4 formed therein. A detailed construction of an insulating film 2, insulating film 6 and protective film 7 illustrated in each of FIGS. 9A and 9B is the same as that illustrated in corresponding each of FIGS. 3A and 3B. Also, the thickness of the $SiO_2$ layer 11b within the semiconductor substrate 11 has been set to be 0.9 $\mu$m. As the laser beam by means of which trimming has been performed, there has been used a YAG laser (produced by Teradyue CORP.) having a wavelength of 1.06 $\mu$m.

The experiment was performed using the same method as that illustrated in FIG. 2 and the examination was made of the laser beam output (the laser beam energy per pulse) which enabled the thin film resistor 3 to be trimmed when the thickness of the Si layer 11c located over the $SiO_2$ layer 11b within the semiconductor substrate 11 was varied. The results are illustrated in FIG. 10.

Figure 10:
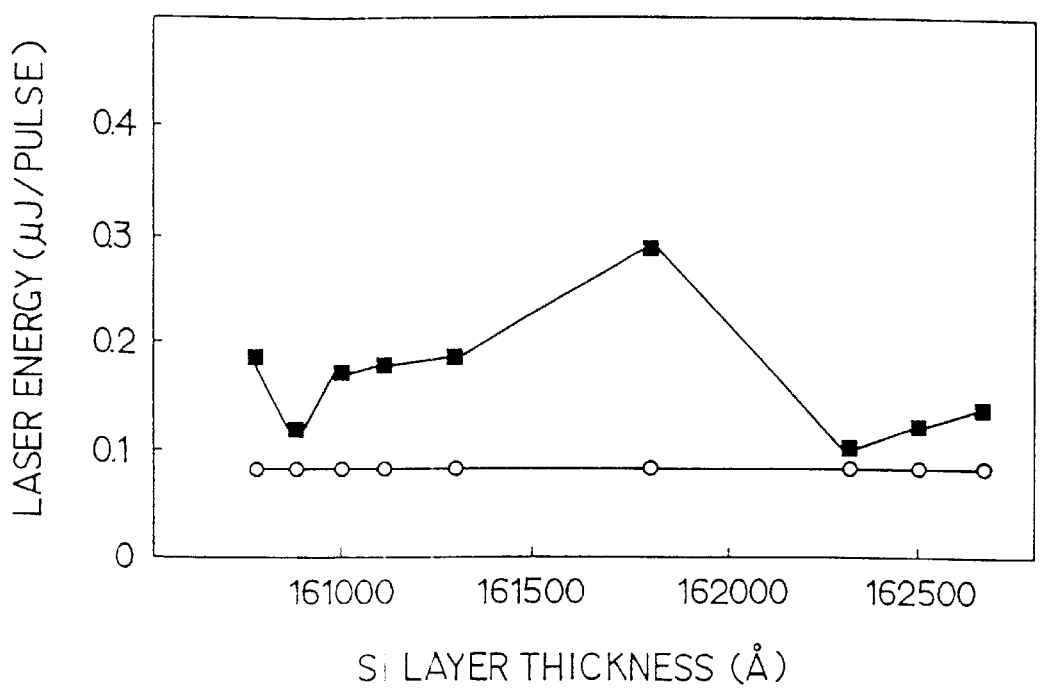
FIG. 10 is a graph illustrating the measured results of the trimming energy.
Figure 16:
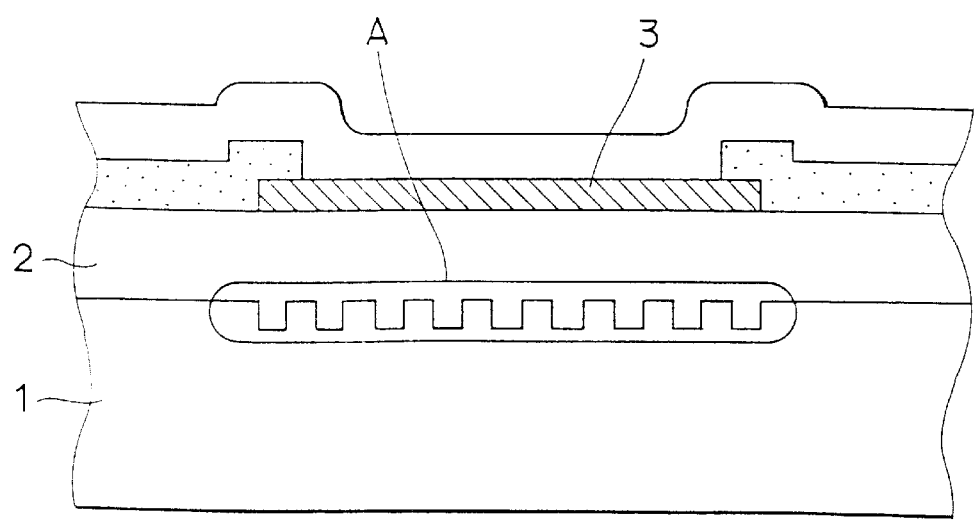
FIG. 16 is a sectional view illustrating a conventional semiconductor device.

In FIG. 10, the mark ■ represents the measured values that have been obtained with regard to the conventional semiconductor device illustrated in FIG. 9A and the mark ○ represents the measured values that have been obtained with regard to the semiconductor device according to the second embodiment that is illustrated in FIG. 9B.

As understood from FIG. 10, in the conventional semiconductor device wherein the surface of the semiconductor substrate 11 is flat, when the thickness of the Si layer 11c is varied, the trimming energy is also largely varied. On the other hand, in the semiconductor device according to the second embodiment, even when the thickness of the Si layer 11c is varied, the trimming energy is stable at around 0.09 $\mu$J.

In the second embodiment, in addition to the laser beam being reflected by the taper potions 4a, the laser beam is refracted when transmitting through the taper portions 4a and, by having its direction changed from the radiation direction of the laser beam, the laser beam that has transmitted through the taper portions 4a reaches the interface between the Si layer 11c and the $SiO_2$ layer 11b at various angles that are different from the angle of the radiation direction of the laser beam. For this reason, the laser beam that has reached that interface is also reflected in a direction that is different from the incidence direction of the laser beam and further this reflected laser beam is again refracted when transmitting through the taper portions 4a. Accordingly, even when compared with the case of the semiconductor substrate 1 illustrated in FIG. 3B, by a larger number of the reflected laser beams that advance in different directions being mingled with one another, it is considered that the interference light composed of the incident lights and the reflected lights also become more intricate. As a result, in the second embodiment, excellent trimming can be performed in a similar manner to the action that has been explained in the first embodiment.

(Third Embodiment)

Next, as a third embodiment, the relationship between the level difference portion 4 and the radiation direction of a laser beam will be explained with reference to FIGS. 1 to 11.

FIG. 11 illustrates the level difference portion 4 having the taper portions 4a illustrated in FIG. 1, which has been formed under the thin film resistor 3 and which have been disposed in stripes each parallel with a straight line that connects the Al electrodes 5a and 5b. The level difference portion 4 is formed such that a cross section thereof that is obtained when the semiconductor device has been sectioned along a direction B in the figure corresponds to the configuration of the level difference portion 4 illustrated in FIG. 1. Also, the hatched regions illustrated in FIG. 11 represent a mask pattern of a nitride film when forming the level difference portion 4 by a LOCOS oxidation method that uses the nitride film as a mask. Accordingly, the taper portions 4a that are formed by so-called "bird's beaks" which are formed at end portions of the LOCOS oxide films are formed at the boundaries between the hatched regions and the non-hatched regions.

By causing a laser beam to be scanned with respect to this semiconductor device in the direction A parallel with the stripes and in the direction B perpendicular thereto, there was performed the same experiment as that which was described in FIGS. 3 and 4. That is, examination was made of the trimming energy when the thickness of the BPSG film 2a was varied. Results are illustrated in FIG. 4.

In FIG. 4, the mark ○ represents the trimming energy when a laser beam has been scanned in the direction A and the mark ● represents the trimming energy when a laser beam has been scanned in the direction B.

According to FIG. 4, although when a laser beam has been scanned in the direction A, the trimming energy remains stable irrespective of the thickness of the BPSG film 2a. The scanning of a laser beam in the direction B thus results in that the trimming energy being largely varied according to the thickness of the BPSG film 2a. Accordingly, by causing a laser beam to be scanned and radiated with respect to the taper portions 4a formed in stripes in parallel with the direction in which the stripes extend, excellent trimming can be performed.

On the other hand, when a laser beam is scanned and radiated with respect to the taper portions 4a formed in stripes in the direction B perpendicular to the direction A in which the stripes extend, the trimming energy is inconveniently varied according to the thickness of the insulating film 2 located under the thin film resistor 3. However, when compared with the conventional case with no level difference portion 4 indicated by the mark ■ in FIG. 4, this scanning and radiation makes it possible to suppress the trimming energy to be smaller. That is, it is understood that while, as illustrated in FIG. 4, in the conventional semiconductor device the trimming energy happens to be 0.8 mW or more at which the protective film is broken according to the thickness of the BPSG film 2a, in the case of scanning a laser beam perpendicularly to the stripes, the trimming energy does not exceed 0.8 mW. Thus, trimming can be performed.

Here, trimming of the thin film resistor 3 using the so-called 'L-letter' cut technique is not only performed by scanning a laser beam only in one direction but also by performing trimming by changing the scanning direction of a laser beam to a direction perpendicular thereto. In the case of performing this 'L-letter' cut trimming, there is the possibility that when in the semiconductor device wherein the level difference portion 4 is formed in stripes and the thin film resistor 3 is formed thereover trimming is performed in the direction perpendicular to the stripes of the level difference portion 4, trimming cannot be performed with the trimming energy being stabilized as mentioned above if the thickness of the insulating film 2 located under the thin film resistor 3 is varied.

It has been determined that stable trimming could be performed by forming the level difference portion 4 located at the interface between the insulating film 2 and semiconductor substrate 1 into a mesh pattern wherein the bottom portions 4b and top portions 4c that are connected by the taper portions 4a alternately appear when viewed from above.

An example of this pattern is illustrated in FIG. 12. In the pattern illustrated in FIG. 12, the hatched regions indicate a mask pattern of a nitride film that has been used in the LOCOS oxidation technique and substantially correspond to the top portions 4c of the level difference portion 4. The configuration of the level difference portion 4 that have been formed by using such a mask pattern is illustrated on the sides of the mask pattern as sectional views taken in the directions A and B in FIG. 12.

Figure 13:
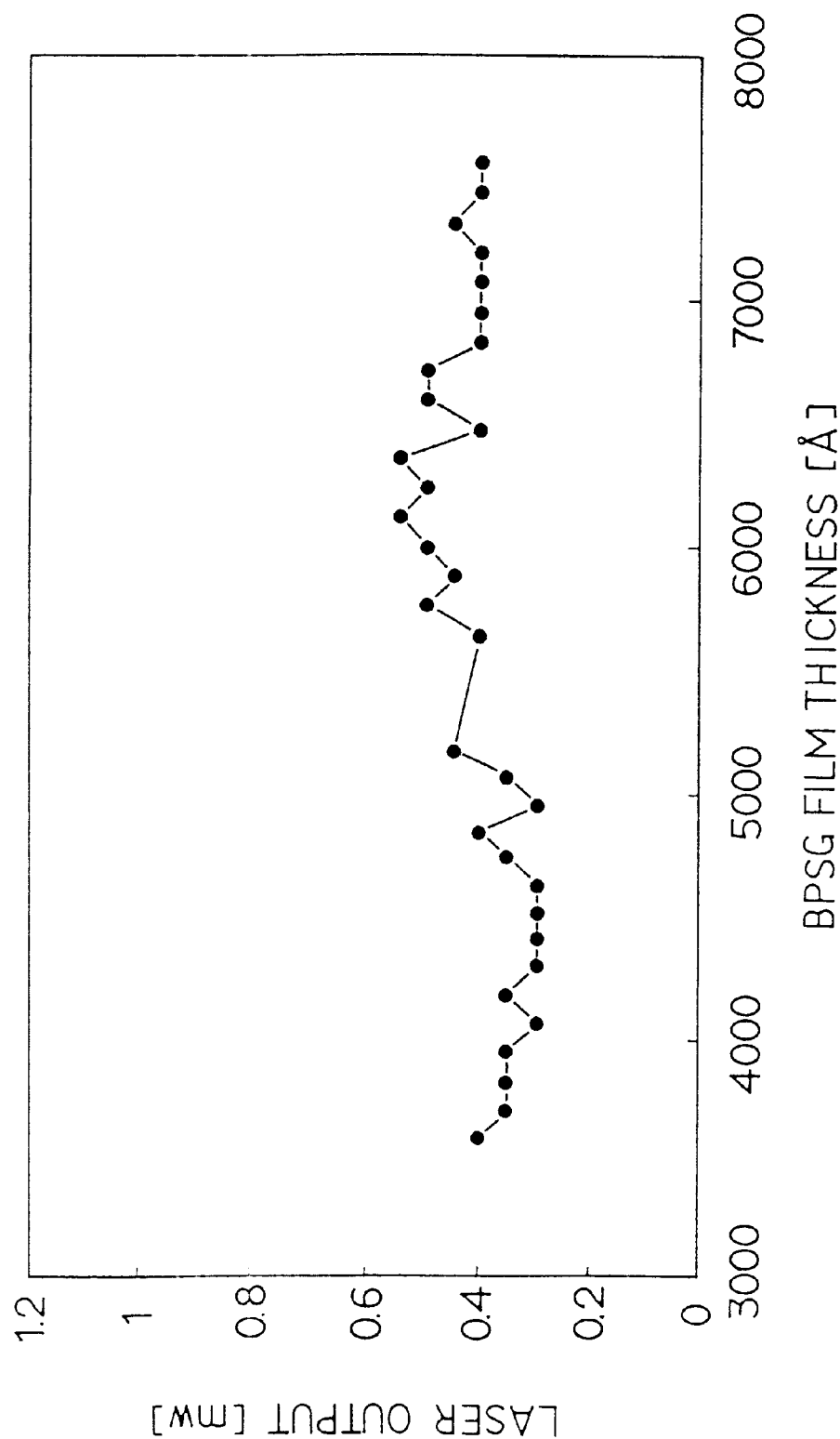
FIG. 13 is a graph illustrating the measured results of the trimming energy when the level differences of the level difference portion 4 were arranged in the form of meshes.

In the results that have been examined, the trimming energy that was needed when trimming was performed of the thin film resistor 3 of the semiconductor device wherein the insulating film 2 was formed over the level difference portion 4 formed by using the mask pattern of FIG. 12 and the thin film resistor 3 was further formed thereover are illustrated in FIG. 13. The dimensions of each hatched region illustrated in FIG. 12 were such that the long side was 2 μm and the short side was 1 μm and the radiated laser was a YLF laser of which spot size was 10 μm. Also, the laser beam was scanned in the arrow-indicated directions in FIG. 12.

As understood from FIGS. 4, 13, in the semiconductor device having the level difference portion 4 formed in stripes and in the semiconductor device having the level difference portion 4 formed in meshes, when the scanning direction of the laser beam has been made parallel with the stripes of the level difference portion 4, the trimming energy is somewhat varied in the semiconductor device having the level difference portion 4 formed in meshes. However, it is understood that when the scanning direction of the laser beam has been made perpendicular to the stripes of the level difference portion 4, the variation in the trimming energy can be suppressed with respect to the semiconductor device having the level difference portion 4 formed in meshes.

Accordingly, in the semiconductor device that has the thin film resistor 3 to which the 'L-letter' cut trimming is required to be performed, due to the level difference portion 4 that has the taper portions being disposed in meshes as illustrated in FIG. 12, stable trimming can be performed without being influenced by the thickness of the insulating film 2 located under the thin film resistor 3.

(Fourth Embodiment)

Next, as a fourth embodiment, an example of a manufacturing method for manufacturing the above-mentioned semiconductor device having the level difference portion 4 and the thin film resistor 3 will be explained with reference to FIGS. 14 and 15.

It is to be noted that while the semiconductor device to be explained here is a semiconductor device wherein respective element regions have been electrically isolated from one another with insulating material, the respective element regions may be electrically isolated from one another by PN junction separations as well known.

Figure 14A:
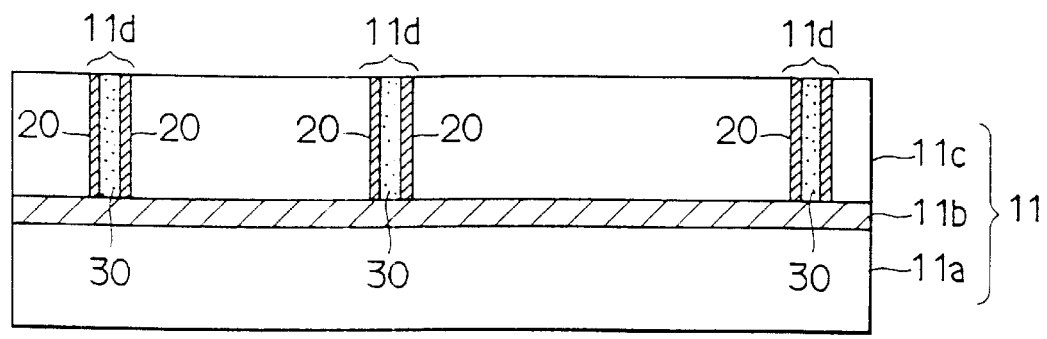
FIGS. 14A to 14C are views illustrating manufacturing steps for manufacturing a semiconductor device.

As illustrated in FIG. 14A, first, a semiconductor substrate 11 is prepared. As described in, for example, Japanese Patent Application Laid-Open No. 6-196550, this semiconductor substrate 11 is formed by bonding together a P-type single crystal Si substrate 11a having a silicon oxide film 11b formed thereon and an N-type single crystal Si substrate 11c at a temperature of approximately 1100° C. after subjecting both to prescribed treatments. Thereafter, the single crystal Si substrate 11c is abraded to a required thickness, and grooves 11d called "trenches" are formed therein by dry etching or the like. Further, oxide films 20 are formed on the side surfaces of each groove, and polysilicon 30 or the like is buried into the grooves. Through the above-mentioned process, the semiconductor substrate 11 is completed. As a result, the adjoining elements are electrically isolated from one another by the oxide films 11b and trenches.

Figure 14B:
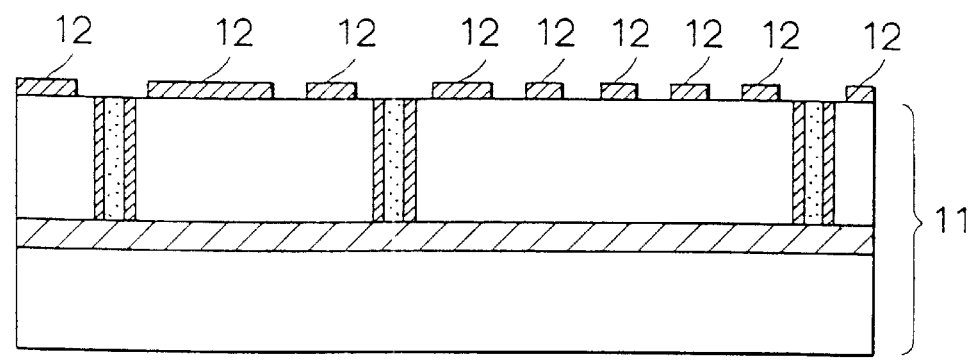

Next, as illustrated in FIG. 14B, an anti-oxidation mask 12 is formed on the surface of the semiconductor substrate 11. This anti-oxidation mask 12 can be formed by depositing a nitride film (SiN) by the use of vapor phase epitaxy such as CVD and patterning it by a photolithography technique.

Thereafter, by the use of a method of oxidation called "the LOCOS oxidation" there is formed a selective oxide films 13 over the trenches and at the regions where the level difference portion 4 are to be formed. It is to be noted that this selective oxide films 13 are formed for the purpose of isolating adjoining elements or semiconductor regions from one another at the surface of the semiconductor substrate 11.

The LOCOS oxidation is performed by, for example, putting the semiconductor substrate 11 having the anti-oxidation mask 12 into a thermal oxidation furnace (not illustrated) and thereafter performing thermal oxidation in an atmosphere of oxygen ($O_2$) and hydrogen ($H_2$) at a temperature of 1000° C. or so for 5 to 6 hours or so.

At a time of this LOCOS oxidation, oxidation proceeds from the end portions of the anti-oxidation masks 12 and the regions called "bird's beaks" are formed at the end portions of the selective oxide films 13, whereby the taper portions 4a such as those illustrated in FIG. 1 are formed in the level difference portion 4 by these bird's beaks. It is to be noted that the pattern of the selective oxide films 13 to form the level difference portion 4 is the pattern such as that illustrated in FIG. 11 or 12. Also, since the taper portions 4a are formed by thermal oxidation, the surface of the taper portion 4a is formed in a smooth surface that is suitable for the reflection of a laser beam that has transmitted through the thin film resistor 3. That is, while the surface of the semiconductor substrate 11 is made to be a mirror surface, the surface of the taper portion 4a also results in the same state as that of this mirror surface.

Figure 14C:
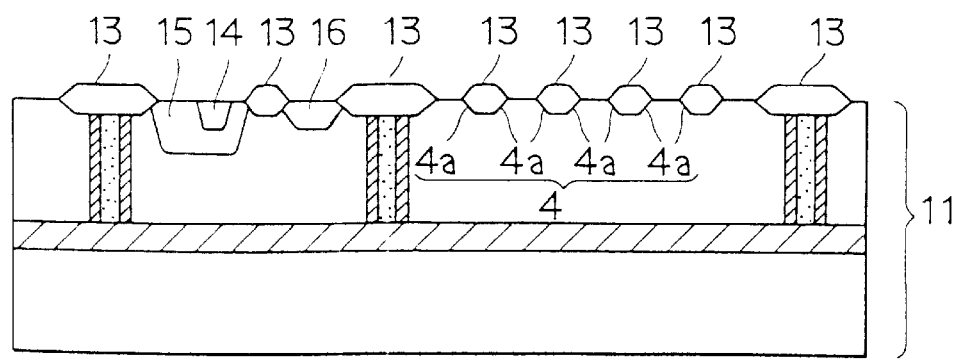
Figure 15A:
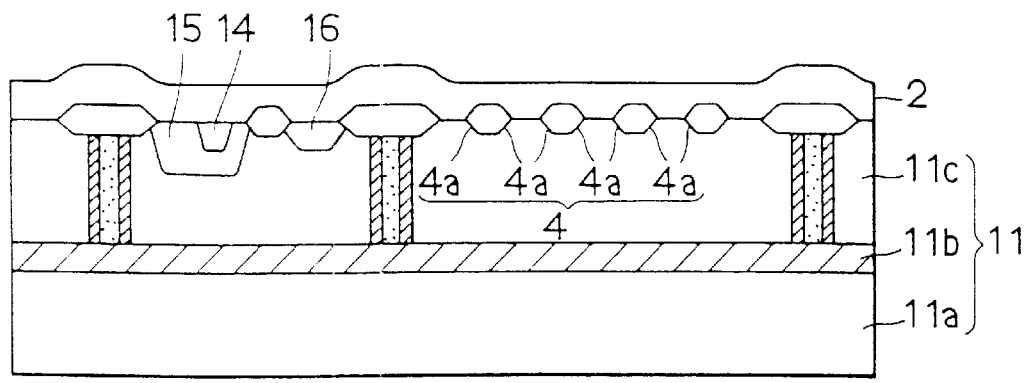
FIGS. 15A to 15C are views illustrating manufacturing steps for manufacturing a semiconductor device.

Next, a semiconductor element such as a transistor is formed in the element region of the semiconductor substrate 11 that has been electrically isolated from the other region by the trench. FIG. 14C illustrates an example wherein there has been formed a bipolar transistor that is composed of an N-type emitter 14, a P-type base 15 and an N-type collector 16. Thereafter, as illustrated in FIG. 15A, the insulating film 2 is deposited by using a BPSG film, an SOG film or the like to thereby flatten the surface of the substrate 11. This insulating film 2 may be a multi-layer film that is the same as the insulating film 2 illustrated in, for example, FIG. 3.

Figure 15B:
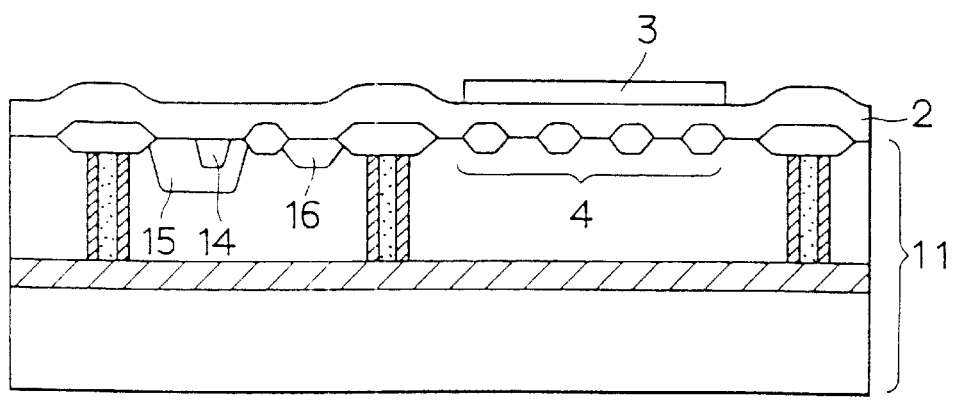

Next, as illustrated in FIG. 15B, the thin film resistor 3 is formed on the insulating film 2 located over the region having the level difference portion 4. This thin film resistor 3 is formed by putting the semiconductor device illustrated in FIG. 15A into, for example, a sputtering device, depositing the CrSi material, which is used as a target, on the insulating film 2 in an atmosphere of an inert gas such as Ar gas or (argon+nitrogen ($N_2$)) gas by sputtering, and patterning the CrSi material into a desired pattern. If at a time of sputtering nitrogen gas is mixed into the inert gas atmosphere, nitrogen is received within the thin film resistor 3.

Figure 15C:
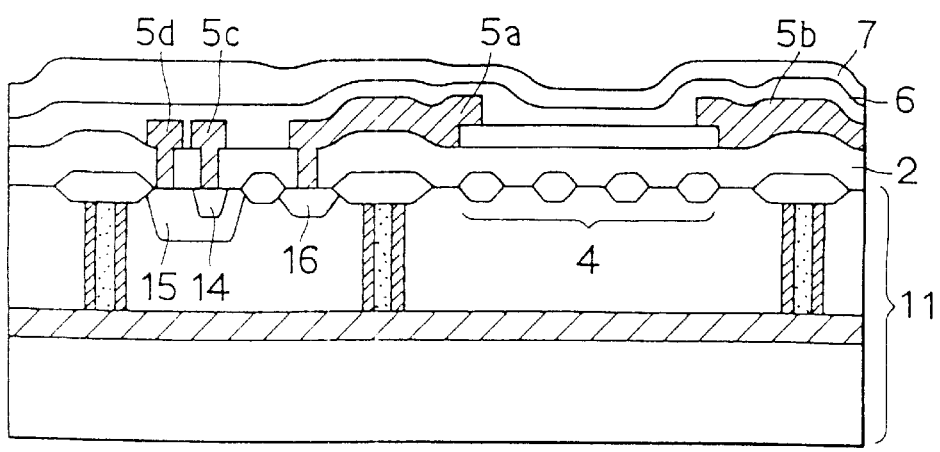

Next, as illustrated in FIG. 15C, contact holes are formed in the insulating film 2 and then electrode wiring material such as Al is deposited in the contact holes and patterned to desired patterns 5a to 5d. In FIG. 15C, the thin film resistor 3 is connected to the collector 16 by means of the wiring pattern 5a.

Next, the insulating film 6 such as an oxide film and the protective film 7 such as a nitride film which is intended to protect the semiconductor device are formed. The insulating film 6 and protective film 7 may be of the same structures as those of, for example, the TEOS film 6a illustrated in FIG. 3 and the protective film 7 illustrated in FIG. 1.

With respect to the semiconductor device that has been formed as mentioned above, laser trimming is performed on the thin film resistor 3 to thereby adjust the resistance value thereof.

According to the forth embodiment that has been explained above, since the formation of the level difference portion 4 is performed simultaneously with the formation of the selective oxidation film 13, it is possible to form the taper portions 4a without a resulting increase in the number of the manufacturing steps.

It is to be noted that as the method for the formation of the taper portions 4a other than the selective oxidation method therefor there are, for example, isotropic etching that uses wet etching, dry etching that uses $CF_4$ gas or $CCL_4$ gas, etc. However, in a case where forming the taper portions 4a by dry etching, it is necessary to thermally oxidize the etched surface after performance of dry etching and thereby make this surface smooth.

While anisotropic etching is also one of the etching techniques, since the Si substrate is usually made to have a surface of which plane orientation is the (100) plane as in the case of the fourth embodiment, the anisotropic etching that is performed using an etchant such as a potassium hydroxide (KOH) solution causes the appearance of the (111) plane. As a result, because of the angle defined between the (100)

plane and the (111) plane becoming approximately 54° the angle a illustrated in FIG. 1 inaptly becomes approximately 36°.

Also, the taper portions 4a may be formed by minimally etching the surface of the silicon substrate in advance and thereafter forming the selective oxidation film. In this case, dry etching is also applicable.

(Fifth Embodiment)

Figure 17:
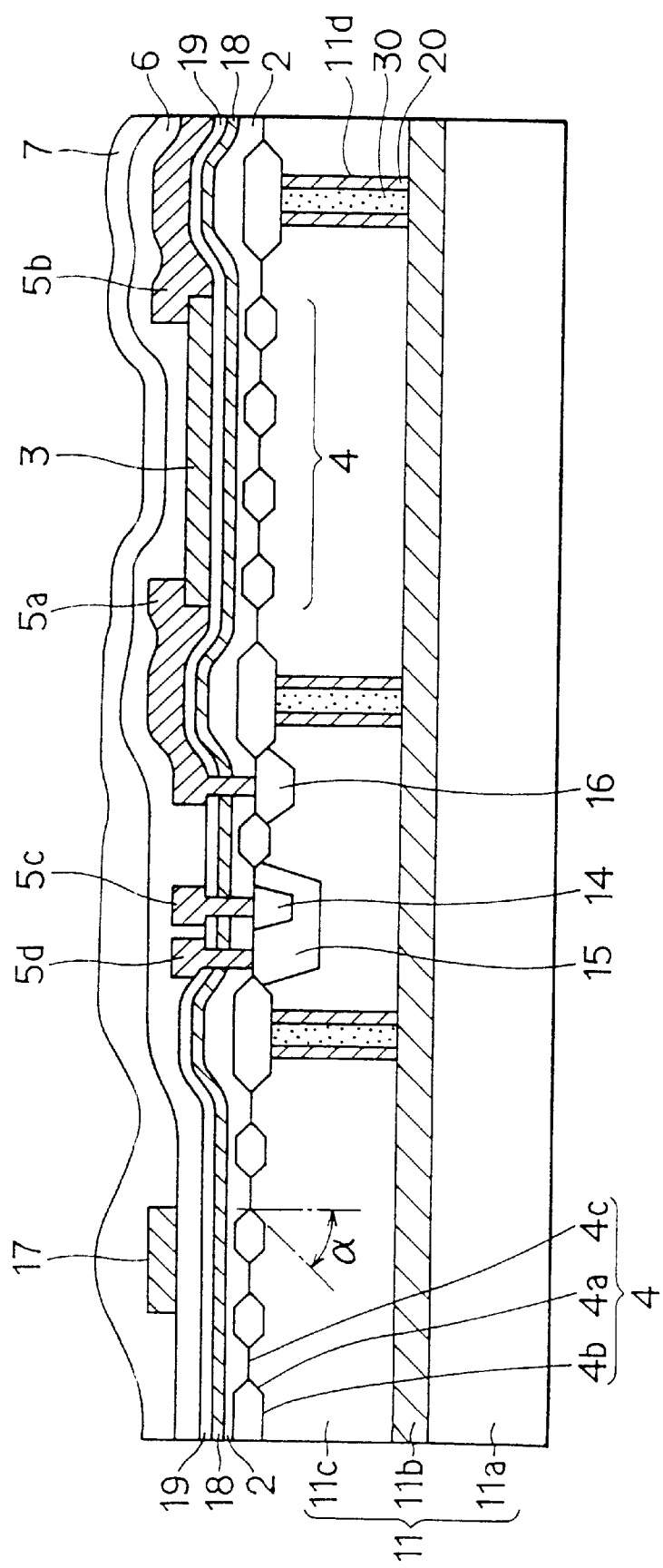
FIG. 17 is a sectional view illustrating a semiconductor device according to a fifth embodiment of the present invention.

FIG. 17 shows a sectional view of a semiconductor device according to the present invention. This figure shows one part internal of a chip, which is divided at a scrub line. The semiconductor device includes a semiconductor substrate 11 formed by an SOI substrate, in which a Si film 11C is formed on a Si film 11a with a $SiO_2$ film (insulating film) 11b interposed therebetween.

The Si film 11C of the semiconductor substrate 11 is divided into plurality of isolated element region, which are electrically isolated one another by trenches 11d (element isolation). In this isolated element region, a bipolar transistor includes an N-type emitter 14, a P-type base 15 and a N-type collector 16; a metallic thin film resistor 3, formed by such as CrSi, connected to the bipolar transistor; and an alignment mark 17 are formed therein. Here, the bipolar transistor and the metallic thin film resistor 3 constitute an element portion. The alignment mark 17 is used for detecting a position of the element portion.

The bipolar transistor includes the N-type emitter 14 formed on the surface layer of the semiconductor substrate, the P-type base 15, and the N-type collector 16. On the semiconductor substrate 11 including the bipolar transistor, an insulating film 2 formed by such as BPSG film including an impurity such as boron (B) or phosphorus (P), and insulating films 18, 19 are laminated in this order. Contact holes are formed in the insulating films 2, 18, 19. Electric wires (electrodes) 5a–5d are connected to the emitter 14, the base 15 and the collector 16, respectively, via the contact holes.

The metallic thin film resistor 3 is formed on the insulating film 19, and electrically connected to the collector 16 via the electric wire. The metallic thin film resistor 3 is set to a desired resistance value by adjusting its size by using a laser trimming. An insulating film 6 is formed on the metallic thin film resistor 3.

The alignment mark 17, which is formed by a metallic thin film such as aluminum (Al), is formed on the insulating film 19. In this embodiment, one part of a second Al, which is the second layer aluminum wire, is used as the alignment mark 17.

Level difference portions 4 are formed at predetermined portions, including both a position under the alignment mark 17 and a position under the metallic thin film resistor 3, of the surface side of the semiconductor substrate 11. Each of the level difference portions 4 includes a bottom portion 4b, a top portion 4c, and a taper portion 4a connecting the bottom 4b and the top portion 4c. As shown in FIG. 17, each taper portion 4a is formed to define as angle of a with respect to the thicknesswise direction of the semiconductor substrate 11.

According to this structure, when the alignment mark 17 for the laser trimming is recognized by using a laser beam, the laser beam will reflect to plurality of directions by reflecting at the taper portions 4a under the alignment mark 17. Therefore, reflection of the laser beam toward the incident root is avoided. That is, a portion of the laser beam, which is reflected toward a thicknesswise direction of the semiconductor substrate, is minimized.

Further, when laser trimming, the laser beam reflects at the taper portions 4a under the metallic thin film resistor 3, then the reflected laser beam will reach the metallic thin film resistor 3.

The angle is set to be 45°<α<90° so as to restrain the reflected laser beam from being parallel with the incident laser beam. Preferably, the angle is set to be 50°≦α≦70°. Further, it is to be noted that the plane orientation of the semiconductor substrate 11 is the (100) plane.

The surface of the semiconductor device including the alignment mark 17 is covered with a protective film 7 such as a nitride film.

Then, as to the semiconductor device having the alignment mark 17 constituted the above, a recognition procedure of the alignment mark 17 at the laser trimming will be explained with reference to FIGS. 18A, 18B.

Figure 18A:
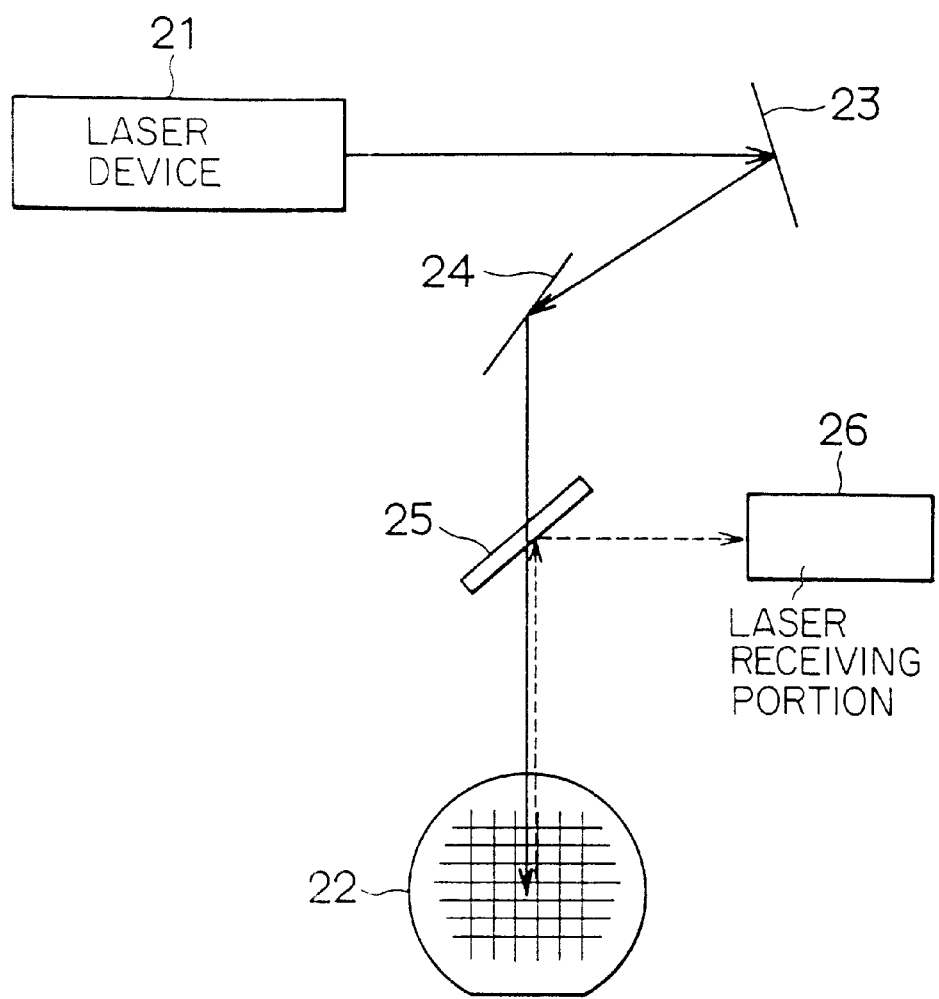
FIGS. 18A, 18B are diagrams illustrating a laser trimming procedure of a semiconductor device.

As shown in FIG. 18A, a laser trimming device includes a laser device 21 for emitting a laser beam; reflector sheets 23, 24, 25 for reflecting the emitted laser beam so that the reflected laser beam perpendicularly reaches a wafer 22 having the semiconductor device shown in FIG. 17; and a laser receiving portion 26 for detecting an intensity of the laser beam reflected by the wafer 22 (hereinafter, "reflection intensity"). Here, the reflection sheet 25 is formed so that it can transmit the laser beam from a rear surface, while it reflects the laser beam from a front surface. In this figure, a solid line represents the laser beam incident to the wafer 22, and a dotted line represents the laser beam reflected from the wafer 22.

When the laser trimming device recognizes (detects) a position of the alignment mark 17 based on the reflected laser beam detected by the laser receiving portion 26, the laser trimming device detects a position of the metallic thin film resistor 3 based on the position of the alignment mark 17. Then the laser trimming device fuses the metallic thin film resistor 3 so that its resistance is set to the desired value.

Figure 18B:
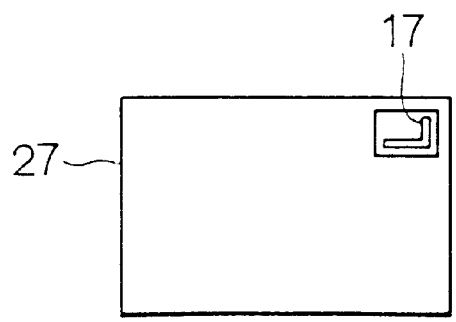

As shown in FIG. 18B, which is an enlarged figure of a round chip, the alignment mark 17 is formed at the corner of each chip formed in a rectangular shape. The alignment mark 17 is formed in each chip.

Figure 19A:
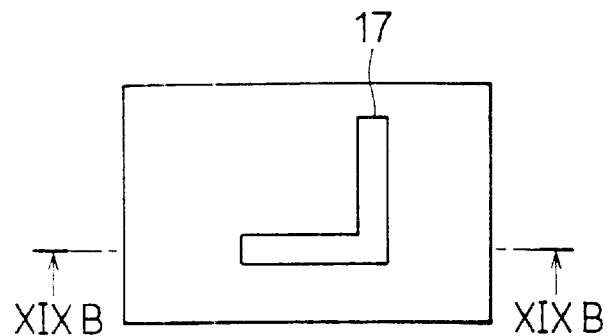
FIGS. 19A, 19B are diagrams illustrating laser beam roots at around an alignment mark of a semiconductor device.
Figure 19B:
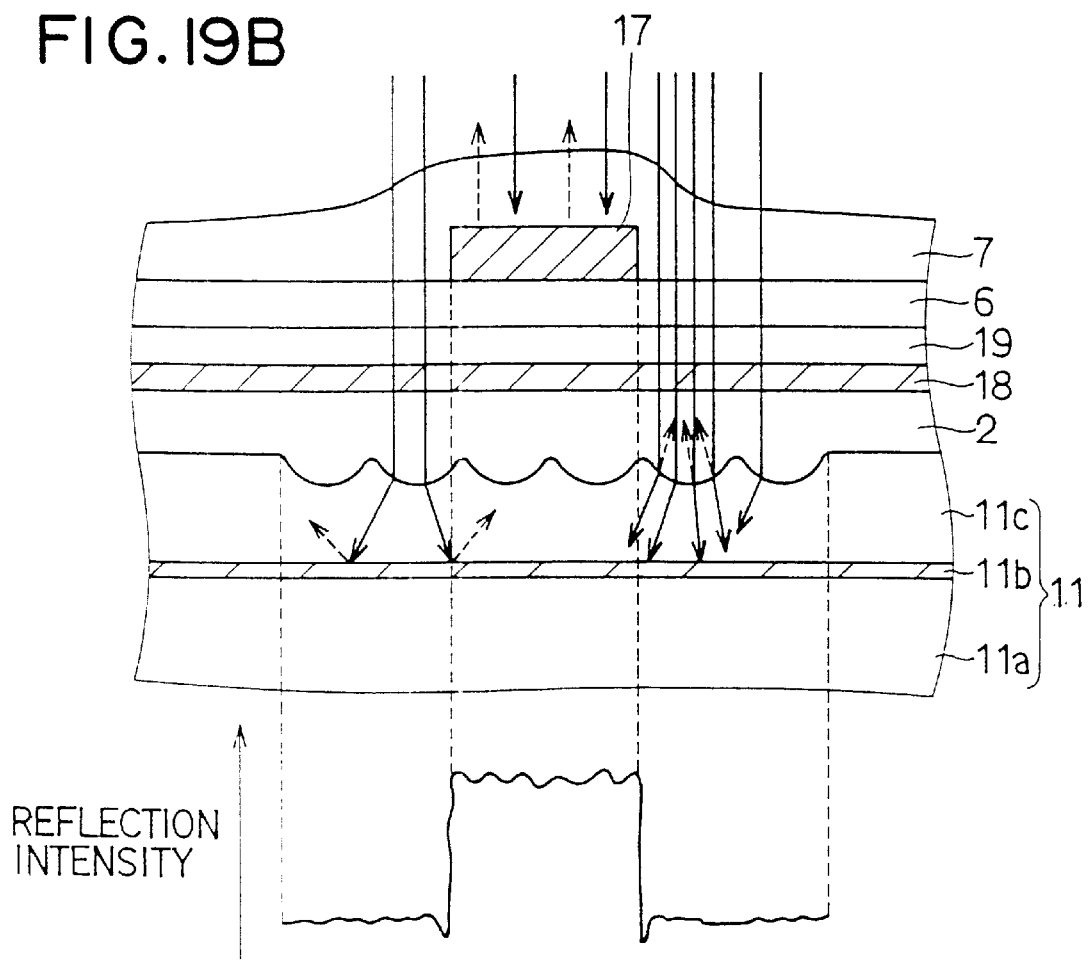

FIG. 19A is an enlarged figure of around the alignment mark 17. FIG. 19B shows a sectional view taken along line XIXB-XIXB in FIG. 19A. In FIG. 19A, roots of laser beams when the laser is radiated thereto are shown by arrows. Here, a solid line represents the laser beam incident to the chip, and a dotted line represents the laser beam reflected from the chip. FIG. 19B also corresponds to the figure showing around the alignment mark 17 in FIG. 17.

As shown in FIG. 19A, the alignment mark is formed so that one part is bent and extended to be perpendicular in such a way as a letter "L". The alignment mark has a predetermined length each of a vertical direction and a horizontal direction with respect to the figure. Therefore, each of a vertical alignment and a horizontal alignment can be performed with a high degree of precision.

As shown in FIG. 19B, the laser beam is radiated perpendicularly to the semiconductor substrate 11 with the semiconductor substrate 11. The alignment marks 17, which do not transmit the laser beam, sufficiently reflect the laser beam. Then the laser receiving portion 26 can adequately detect the reflection intensity of the laser beam reflected by the alignment marks 17.

Next, a reflection condition of the laser beam around the alignment mark 17 will be explained.

At the insulating films 6, 18, 19 and the BPSG film 2, which are formed by such as a P—SiN film or a TEOS film, reflect the laser beam at each of the surfaces. However, since these films 6, 18, 19, 2 transmit almost all the laser beam, the amount of reflected laser is small.

To the contrary, at the Si film 11c, the laser beam is reflected toward various directions due to the level difference portion 4 formed at the surface of the Si film 11c, and the laser transmitting through the Si film 11c is transmitted toward various directions (lens effect). Therefore, a reflection intensity of the laser reflected at the surface of the Si film 11c is weakened, and also a reflection intensity of the laser reflected at the surface of the buried $SiO_2$ film 11b or the Si substrate 11a is weakened.

Regarding the reflection intensities of the alignment mark 17 and the surrounding area, the reflection intensity of the surrounding area is much smaller than that of the alignment mark 17. Hence, the position of the alignment mark 17 can be precisely recognized (detected). That is, the recognizablity of the alignment mark 17 can be improved.

In this way, since the position of the alignment mark 17 can be precisely recognized (detected), the metallic thin film resistor 3 can be precisely laser-trimmed.

Next, manufacturing steps for manufacturing a semiconductor device shown in FIG. 17 will be explained with reference to FIGS. 20A–20F.

Figure 20A:
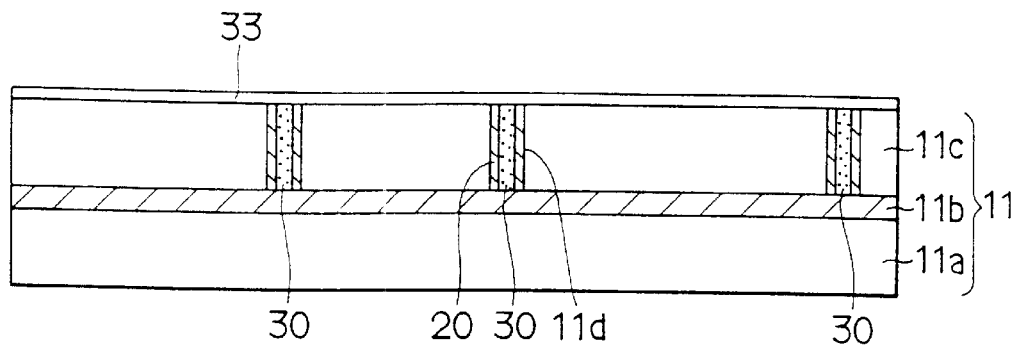
FIGS. 20A to 20F are views illustrating manufacturing steps for manufacturing a semiconductor device.

[Step shown in FIG. 20A]

First, a semiconductor substrate 11 is prepared. This semiconductor substrate 11 is formed by bonding together a P-type single crystal Si substrate 11a having a silicon oxide film 11b formed thereon and an N-type single crystal Si substrate 11c at a temperature of approximately 1100° C. after subjecting both to prescribed treatments. Thereafter, the single crystal Si substrate 11c is abraded to a required thickness, and grooves as the trenches 11d are formed therein by dry etching or the like. Further, oxide films 20 are formed on the side surfaces of each trench 11d, and polysilicon 30 or the like is buried into the trenches 11d. Through the above-mentioned process, the semiconductor substrate 11 is completed. As a result, the adjoining elements are electrically isolated from one another by the oxide films 11b and trenches 11d. Then, a silicon oxide film ($SiO_2$) 33 is formed on whole surface of the semiconductor substrate 11 by a thermal oxidation.

Figure 20B:
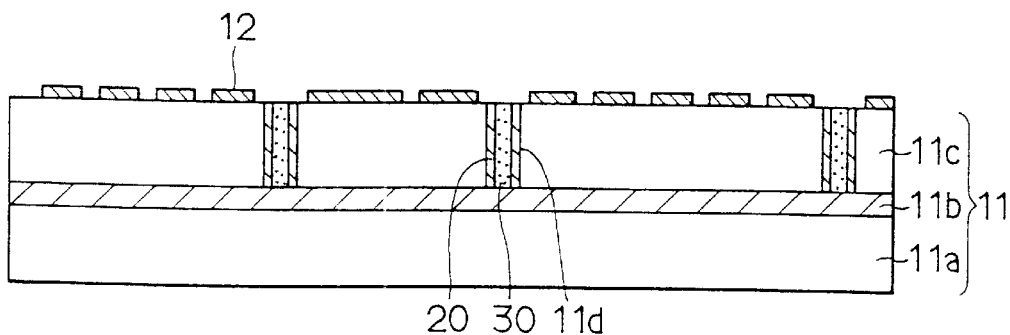

[Step shown in FIG. 20B]

An anti-oxidation mask 12 is formed on the surface of the semiconductor substrate 11. This anti-oxidation mask 12 can be formed by depositing a nitride film (SiN) by the use of vapor phase epitaxy such as CVD and patterning it by a photolithography technique.

Figure 20C:
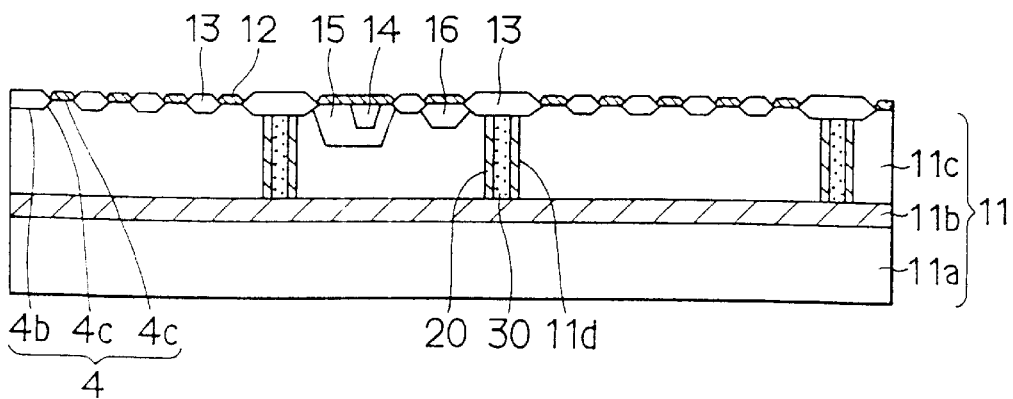

[Step shown in FIG. 20C]

Thereafter, by the use of a method of oxidation called "the LOCOS oxidation" there is formed a selective oxide films 13 over the trenches lid and at the regions where the level difference portion 4 are to be formed. The selective oxide films 13 are formed for the purpose of isolating adjoining elements or semiconductor regions from one another at the surface of the semiconductor substrate 11.

The LOCOS oxidation is performed by, for example, putting the semiconductor substrate 11 having the anti-oxidation mask 12 into a thermal oxidation furnace (not illustrated) and thereafter performing thermal oxidation in an atmosphere of oxygen ($O_2$) and hydrogen ($H_2$) at a temperature of 1000° C. or so for 5 to 6 hours or so.

At the time of this LOCOS oxidation, oxidation proceeds from the end portions of the anti-oxidation masks 12 and the regions called "bird's beaks" are formed at the end portions of the selective oxide films 13, whereby the taper portions 4a such as those illustrated in FIG. 17 are formed in the level difference portion 4 by these bird's beaks. The pattern of the selective oxide films 13 to form the level difference portion 4 is the pattern such as that illustrated, for example in FIG. 17. Also, since the taper portions 4a are formed by thermal oxidation, the surface of the taper portion 4a is formed into a smooth surface that is suitable for the reflection of a laser beam that has transmitted through the metallic thin film resistor 3. That is, while the surface of the semiconductor substrate 11 is made to be a mirror surface, the surface of the taper portion 4a also results in the same state as that of this mirror surface.

Next, a semiconductor element such as a transistor is formed in the element portion of the semiconductor substrate 11. That is, by ion implantation to the single crystal Si substrate 11c, a bipolar transistor including an N-type emitter 14, a P-type base 15, and an N-type collector 16 are formed.

Figure 20D:
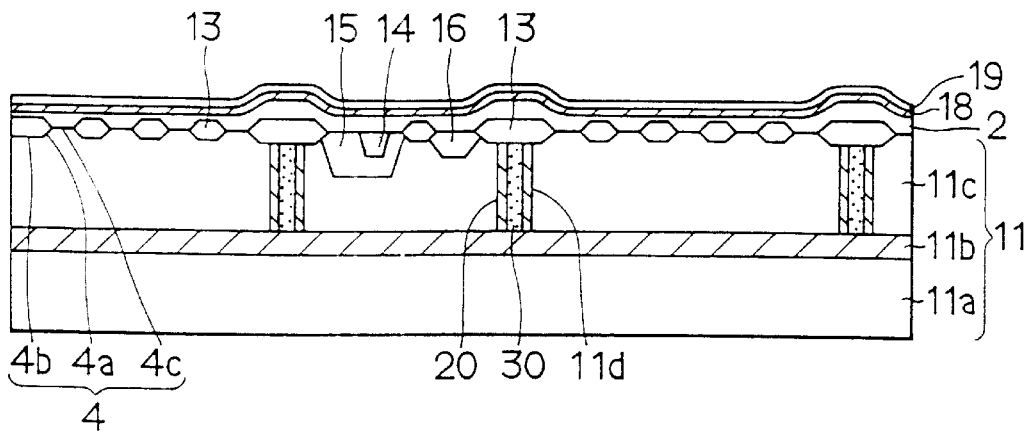

[Step shown in FIG. 20D]

A BPSG film 2, a insulating film 18, and a insulating film 19 are deposited on whole surface of the wafer in this order.

Figure 20E:
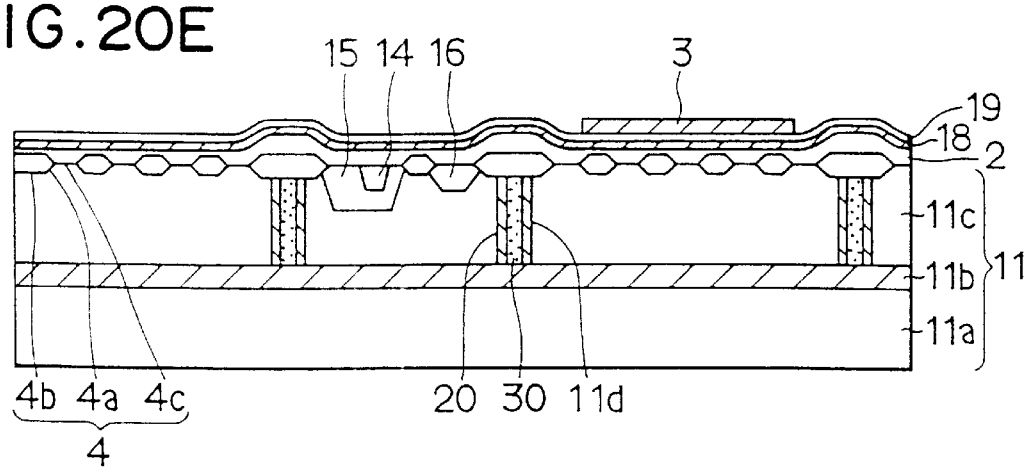

[Step shown in FIG. 20E]

Next, a metallic thin film resistor 3 is formed on the insulating film 19 located over the region having the level difference portion 4. This metallic thin film resistor 3 is formed by depositing the CrSi material, which is used as a target, on the insulating film 2 in an atmosphere of an inert gas such as Ar gas or (argon+nitrogen ($N_2$)) gas by sputtering. If at a time of sputtering nitrogen gas is mixed into the inert gas atmosphere, nitrogen is received within the metallic thin film resistor 3.

Figure 20F:
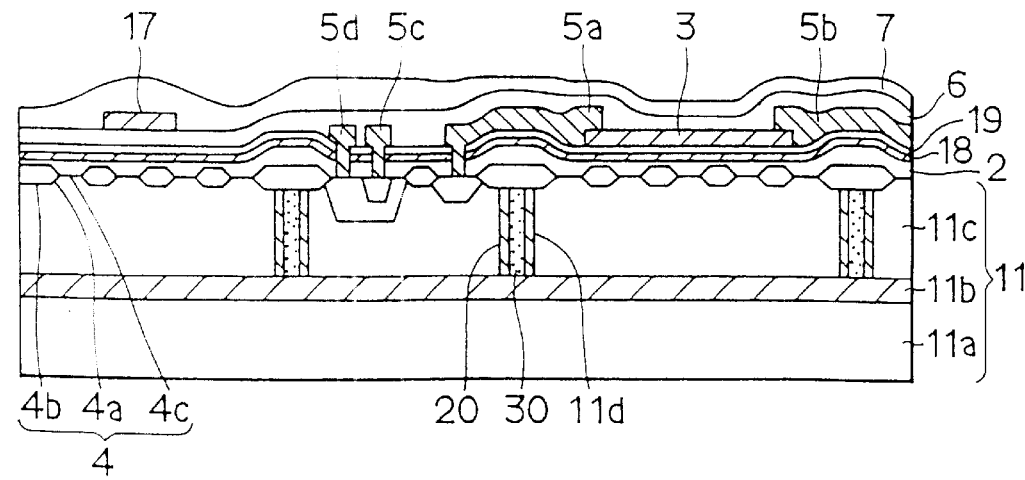
Figure 21A:
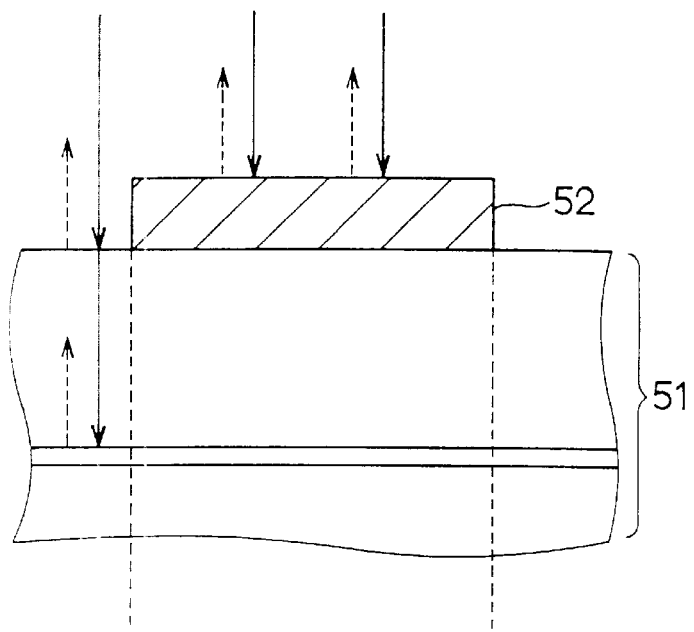
FIGS. 21A, 21B are diagrams illustrating an element that an alignment mark is disposed on a scrub line according to related art.
Figure 21B:
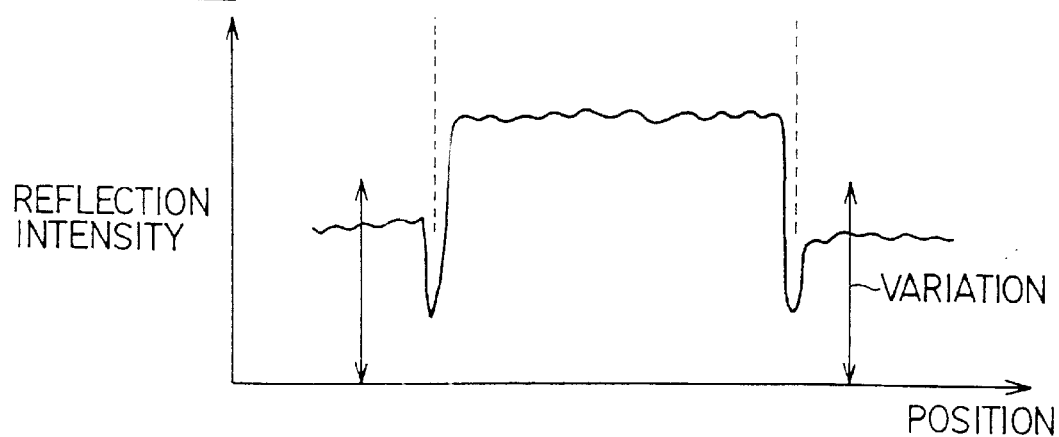
Figure 22A:
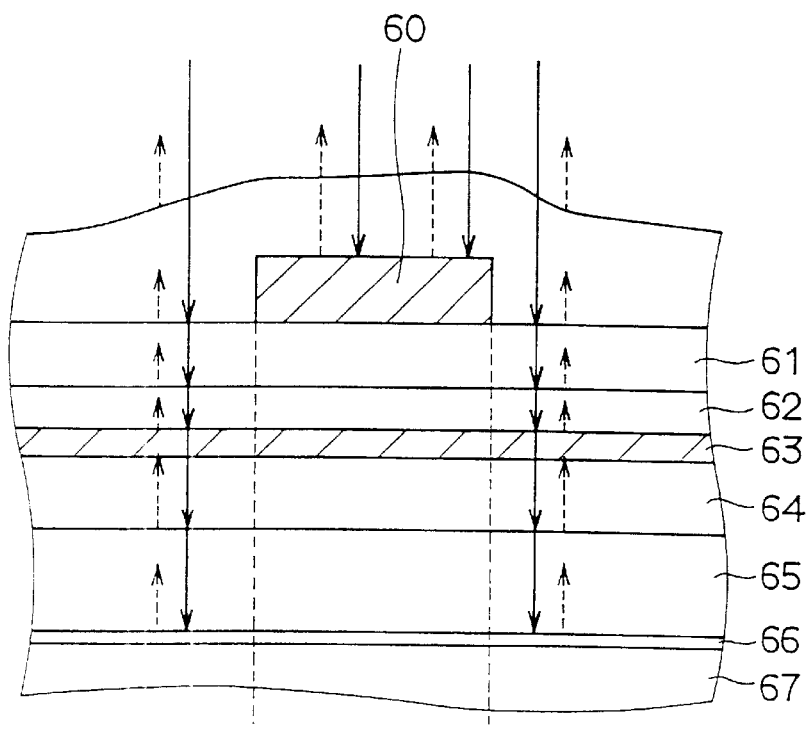
FIGS. 22A, 22B are diagrams illustrating an element that an alignment mark is disposed in a chip according to related art.
Figure 22B:
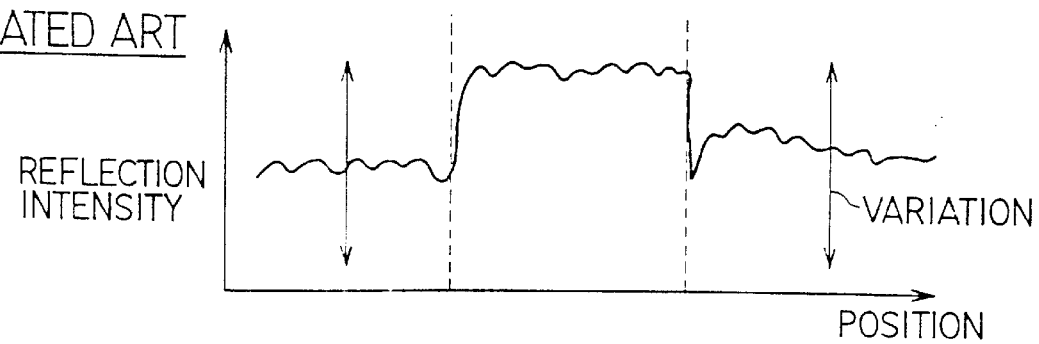

[Step shown in FIG. 20F]

Next, contact holes are formed in the BPSG film 2, insulating films 18, 19. Then electrode wiring material such as Al is deposited in the contact holes and patterned to desired patterns 5a to 5d. The thin film resistor 3 in FIG. 20F is connected to the collector 16 by means of the wiring pattern 5a.

Next, an insulating film 6 is formed on the wafer. An Al film is deposited on the insulating film 6, then patterned to desired patterns having second Al wiring patterns and the alignment mark 17. Then, a protective film 7 such as a silicon nitride film is formed on the wafer.

Thereafter, the metallic thin film resistor 3 is trimmed by laser trimming so that its resistance is to set desired value. Then, the manufacturing steps for manufacturing a semiconductor device is completed after cutting the wafer along a scrub line by a dicing cut.

With respect to the semiconductor device that has been formed as mentioned above, laser trimming is performed of the thin film resistor 3 to thereby adjust the resistance value thereof.

According to this embodiment that has been explained above, since the formation of the level difference portion 4 is performed simultaneously with the formation of the selective oxidation film 13, it is possible to form the level difference portions 4 without being followed by an increase in the number of the manufacturing steps.

Furthermore, the semiconductor substrate 11 has plurality of films including the Si substrate 11a, the $SiO_2$ film 11b and the Si film 11c. In the case of such a laminated semiconductor substrate, it becomes difficult to detect the alignment mark precisely because each film 11a, 11b, 11c reflects the laser beam, respectively. Hence, by forming the selective oxidation film (LOCOS film) having the taper portions 4a in the Si film 11c, the taper portions 4a can not only reflect the laser beam that is reflected at the surface of the Si film 11c toward the different direction from a normal direction, but also directs the laser beam that is transmitted through the Si film 11c toward the different direction from a normal direction. Hence, since the laser beam that is reflected at the surface of the Si substrate 11a and the SiO$_2$ film 11b is directed to the different direction from a normal direction, the alignment can be detected precisely.

(Other Embodiment)

In the above-mentioned embodiments, the taper portions 4a are formed by the selective oxidation. However, it is noted that as the method for the formation of the taper portions 4a other than the selective oxidation method therefor there are, for example, isotropic etching that uses wet etching, dry etching that uses CF$_4$ gas or CCL$_4$ gas, etc. However, in a case where forming the taper portions 4a by dry etching, it is necessary to thermally oxidize the etched surface after performance of dry etching and thereby make this surface smooth.

While there is also anisotropic etching as one of the etching techniques, since the Si substrate is usually made to have a surface of which plane orientation is the (100) plane as in the case of the fourth embodiment, the anisotropic etching that is performed using an etchant such as a potassium hydroxide (KOH) solution causes the appearance of the (111) plane. As a result, because of the angle defined between the (100) plane and the (111) plane becoming approximately 54°, the angle α illustrated in FIG. 17 inaptly becomes approximately 36°.

Also, the taper portions 4a may be formed by slightly etching the surface of the silicon substrate in advance and thereafter forming the selective oxidation film. In this case, dry etching is also applicable.

In the above-mentioned embodiments, the present inventions are adopted to the SOI substrate, in which plurality of films are laminated. However, the present inventions may be adopted to Si substrate replace with the SOI substrate.

In the above-mentioned embodiments, the second Al wire is used as the alignment mark 17. However, the other electric wire (such as the first Al) may be used as the alignment mark replace with the second Al. Furthermore, the other wiring material such as Cu, Ti, TiN, Au, Ag may be used replace with Al.

In the fifth embodiment, the alignment mark 17 is used for the alignment of laser trimming of the metallic thin film resistor 3. However, the present invention can be adopted to the other alignment such as an alignment of trimming of other element like an electrode, a capacitor, or a stub of a monolithic microwave integrated circuit (MMIC), or an alignment of a mask and a substrate during a photolithography using a light.

When the present invention is adopted to the alignment of the mask and the substrate during the photolithography, it can avoid occurrence of an interference fringe of the light. As the lighting device for emitting the light for the alignment, one of i-ray, He—Ne laser beam and halogen light (Broadband alignment) can be used. The above-mentioned i-ray, He—Ne laser beam and halogen light may be used by switching alternately. In this situation, the mask can be detected precisely because it can perform high contrast detecting of the alignment mark.

What is claimed is:

1. A semiconductor device comprising:
    a semiconductor substrate;
    an oblique region that is formed at a surface of the semiconductor substrate and made to be oblique with respect to the thicknesswise direction of the semiconductor substrate;
    an insulating film that is formed on the surface of the semiconductor substrate which includes the oblique region; and
    a thin film element that is located over the insulating film and formed above the oblique region,
    wherein the oblique region reflects light for trimming the thin film element, which has transmitted through the thin film element, so that the light reflected by the oblique region reaches the thin film element.

2. A semiconductor device as set forth in claim 1, wherein the oblique region is set to be at an angle that is larger than 45° and smaller than 90° with respect to the thicknesswise direction of the semiconductor substrate.

3. A semiconductor device as set forth in claim 1, wherein the oblique region is curvilinear.

4. A semiconductor device as set forth in claim 1, wherein the oblique region is located between a top portion and a bottom portion of a level difference portion so that the level difference portion is formed by the oblique region.

5. A semiconductor device as set forth in claim 4, wherein at least one of a connection portion between the oblique region and the top portion of the level difference portion and a connection portion between the oblique region and the bottom portion of the level difference portion is formed to be curvilinear and gentle.

6. A semiconductor device as set forth in claim 1, wherein a plurality of the oblique regions are formed within a spot size of the light that is radiated onto the thin film element.

7. A semiconductor device as set forth in claim 1, wherein the oblique region is formed by a selective oxidation technique that performs oxidation by using an anti-oxidation mask.

8. A semiconductor device as set forth in claim 1, wherein the oblique region is disposed in the form of stripes when viewed from above.

9. A semiconductor device as set forth in claim 1, wherein the oblique region is located between a top portion and a bottom portion of a level difference portion so that the level difference portion is formed by the oblique region and the top portion and bottom portion of the level difference portion are alternately disposed in a form of meshes when viewed from above.

10. A semiconductor device as set forth in claim 1, wherein the semiconductor substrate is composed of a first semiconductor layer, an insulating layer formed on the first semiconductor layer and a second semiconductor layer formed on the insulating layer, whereby the oblique region is formed at a surface of the second semiconductor layer.

11. A semiconductor device comprising:
    a semiconductor substrate;
    an insulating film formed on the semiconductor substrate;
    a thin film element formed on the insulating film; and
    a level difference portion of which sectional configuration is trapezoidal and which has been formed at an interface between the semiconductor substrate and the insulating film that is located under the thin film element,
    wherein an oblique side of the trapezoidal level difference portion reflects light for trimming the thin film element, which has transmitted through the thin film element, so that the light reflected by the oblique side reaches the thin film element.

12. A semiconductor comprising:
a semiconductor substrate;
a thin film element formed on the semiconductor substrate that has transparency for light being radiated thereto parallel to a normal direction of the semiconductor substrate; and
a reflector disposed in the semiconductor substrate below the thin film element, that has an oblique region made to be oblique with respect to a normal direction of the semiconductor substrate, the oblique region reflecting the light transmitted through the thin film element to a different direction of the normal direction; and
wherein the semiconductor substrate is composed of a first semiconductor layer, an insulating layer formed on the first semiconductor layer and a second semiconductor layer formed on the insulating layer, whereby the oblique region is formed at a surface of the second semiconductor layer.

13. A semiconductor device as set forth in claim 12, wherein the reflector is formed by a LOCOS film disposed in the semiconductor substrate, and the oblique region is formed by an oblique portion of the LOCOS film.

14. A semiconductor device as set forth in claim 13, wherein:
the semiconductor substrate has a plurality of semiconductor regions each of which is isolated by trenches and a plurality of isolation LOCOS films provided on the trenches, and
the LOCOS film constituting the reflector is smaller than the isolation LOCOS film.

15. A semiconductor device as set forth in claim 12, wherein the thin film element is a thin film resistor, and is disposed to the light to be trimmed.

16. A semiconductor device as set forth in claim 12, wherein the thin film element is an alignment mark, and is disposed to the light to align the semiconductor substrate.

17. A semiconductor device comprising:
a semiconductor substrate having an element portion including a chip;
an insulating film formed on the semiconductor substrate;
an alignment mark disposed in the chip; and
an oblique region that is formed in the surface side of the semiconductor substrate at a surrounding area of the alignment mark, and made to be oblique with respect to a normal direction of the semiconductor substrate,
wherein the oblique region at the surrounding area reflects a light parallel to the normal direction to a different direction of the normal direction, and
the semiconductor substrate is composed of a first semiconductor layer, an insulating layer formed on the first semiconductor layer and a second semiconductor layer formed on the insulating layer, whereby the oblique region is formed at a surface of the second semiconductor layer.

18. A semiconductor device as set forth in claim 17, wherein the oblique region is formed by a selective oxidation technique that performs oxidation by using an anti-oxidation mask.

19. A semiconductor device as set forth in claim 17, wherein the element portion further comprises a thin film element formed by a laser trimming, and the alignment mark is used for detecting a position of the thin film element alignment when the thin film element is laser-trimmed.

20. A semiconductor device comprising:
a semiconductor substrate having an element portion including a chip;
an insulating film formed on the semiconductor substrate;
an alignment mark disposed in the chip; and
an oblique region that is formed in the surface side of the semiconductor substrate at a surrounding area of the alignment mark, and made to be oblique with respect to a normal direction of the semiconductor substrate,
wherein the oblique region at the surrounding area reflects a light parallel to the normal direction to a different direction of the normal direction, and
the oblique region is set to be at an angle that is larger than 45° and smaller than 90° with respect to the normal direction of the semiconductor substrate.

21. A semiconductor device comprising:
a semiconductor substrate having an element portion including a chip;
an insulating film formed on the semiconductor substrate;
an alignment mark disposed in the chip; and
an oblique region that is formed in the surface side of the semiconductor substrate at a surrounding area of the alignment mark, and made to be oblique with respect to normal direction of the semiconductor substrate,
wherein the oblique region at the surrounding area reflects a light parallel to the normal direction to a different direction of the normal direction, and
the oblique region is curvilinear.

22. A semiconductor device comprising:
a semiconductor substrate;
a plurality of oblique regions formed at a surface of the semiconductor substrate;
an insulating film formed on the surface of the semiconductor substrate which includes the oblique regions, and including a flattening film for flattening a surface of the oblique regions; and
a thin film element located over the insulating film and formed on the flattening film of the insulating film which is above the oblique regions.

23. A semiconductor device comprising:
a semiconductor substrate;
an insulating film formed on the semiconductor substrate;
a thin film element formed on the insulating film; and
a plurality of level difference portions each of which having a sectional configuration which is trapezoidal and each of which has been formed at an interface between the semiconductor substrate and the insulating film that is located under the thin film element.

24. A semiconductor device comprising:
a semiconductor substrate;
a thin film element formed on the semiconductor substrate that has transparency for light being radiated thereto parallel to a normal direction of the semiconductor substrate; and
a reflector constituted by a bird's beak portion of a LOCOS film, being disposed in the semiconductor substrate below the thin film element, and having an oblique region which is oblique with respect to a normal direction of the semiconductor substrate, the oblique region reflecting the light transmitted through the thin film element to a different direction from the normal direction.

25. A semiconductor device as set forth in claim 24, wherein the LOCOS film constituting the reflector is disposed in the semiconductor substrate, and the oblique region is formed by an oblique portion of the LOCOS film.

26. A semiconductor device as set forth in claim 25, wherein:
the semiconductor substrate has a plurality of semiconductor regions each of which is isolated by trenches and a plurality of isolation LOCOS films provided on the trenches, and
the LOCOS film constituting the reflector is smaller than the isolation LOCOS films.

27. A semiconductor device as set forth in claim 24, wherein the thin film element is a thin film resistor, and is disposed to the light in order to be trimmed.

28. A semiconductor device comprising:
a semiconductor substrate having an element portion including a chip;
an insulating film formed on the semiconductor substrate;
an alignment mark disposed in the chip; and
an oblique region that is formed in the surface side of the semiconductor substrate at a surrounding area of the alignment mark, and made to be oblique with respect to a normal direction of the semiconductor substrate,
wherein the oblique region is constituted by a bird's beak portion of a LOCOS film, and the oblique region at the surrounding area of the alignment mark reflects a light parallel to the normal direction to a different direction from the normal direction.

29. A semiconductor device as set forth in claim 28, wherein the oblique region is set to be at an angle that is larger than 45° and smaller than 90° with respect to the normal direction of toe semiconductor substrate.

30. A semiconductor device as set forth in claim 28, wherein the oblique region is curvilinear.

31. A semiconductor device is set forth in claim 28, wherein the oblique region is formed by a selective oxidation technique that performs oxidation by using, an anti-oxidation mask.

32. A semiconductor device as set forth in claim 28, wherein the semiconductor substrate is composed of a first semiconductor layer, an insulating layer formed on the first semiconductor layer and a second semiconductor layer formed on the insulation layer, whereby the oblique region is formed at a surface of the second semiconductor layer.

33. A semiconductor device as set forth in claim 28, wherein the element portion further comprises a thin film element formed by a laser trimming, and the alignment mask is used for detecting a position of the thin film element alignment when the thin film element is laser-trimmed.

34. A semiconductor device comprising:
an SOI substrate having a support substrate and a semiconductor layer formed on the support substrate with an insulating film interposed therebetween;
an oblique region formed at a surface of the semiconductor layer which includes the oblique region; and
a thin film element located over the insulating film and formed above the oblique region.

35. A semiconductor device as set forth in claim 34, herein the insulating film includes a LOCOS film formed in correspondence with the oblique region and a flattening film formed on the LOCOS film, and the thin film element is formed on the flattening film.

36. A semiconductor device comprising:
a semiconductor substrate having a plurality of oblique regions, each of which is defined by a connecting portion between a top portion and a bottom portion, said top and bottom portions being formed at a surface of the semiconductor substrate, each of the oblique regions being oblique with respect to the thicknesswise direction of the semiconductor substrate, and the oblique regions being formed in a mesh pattern in which the top portion and the bottom portion are alternately formed;
an insulating film formed on the surface of the semiconductor substrate which includes the oblique regions; and
a thin film element located over the insulating film and formed above the oblique regions.

* * * * *